(12) United States Patent
Shinkai

(10) Patent No.: US 11,769,717 B2
(45) Date of Patent: Sep. 26, 2023

(54) SEMICONDUCTOR DEVICE FOR REDUCING CONCENTRATION OF THERMAL STRESS ACTING ON BONDING LAYERS

(71) Applicant: ROHM CO., LTD., Kyoto (JP)

(72) Inventor: Hiroyuki Shinkai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/939,559

(22) Filed: Jul. 27, 2020

(65) Prior Publication Data

US 2021/0066176 A1    Mar. 4, 2021

(30) Foreign Application Priority Data

Aug. 27, 2019 (JP) ................... 2019-154361

(51) Int. Cl.
*H01L 23/498* (2006.01)
*H01L 23/00* (2006.01)
(Continued)

(52) U.S. Cl.
CPC .... *H01L 23/49811* (2013.01); *H01L 23/3121* (2013.01); *H01L 24/06* (2013.01);
(Continued)

(58) Field of Classification Search
CPC ........... H01L 23/49811; H01L 23/3121; H01L 24/06; H01L 24/16; H01L 25/16; H01L 2224/0401; H01L 2224/16227
(Continued)

(56) References Cited

U.S. PATENT DOCUMENTS 5,641,946 A * 6/1997 Shim .................. H01L 21/4853
  174/261
2006/0231952 A1* 10/2006 Kim ...................... H05K 3/303
  257/E23.07
(Continued)

FOREIGN PATENT DOCUMENTS

JP    2014-110355 A    6/2014
JP      201769380 A    4/2017
JP     2019140179 A    8/2019

OTHER PUBLICATIONS

Office Action issued in Japanese Application No. 2019-154361, dated Jun. 6, 2023, with English translation.

*Primary Examiner* — Lex H Malsawma
*Assistant Examiner* — Laura M Dykes
(74) *Attorney, Agent, or Firm* — HAMRE, SCHUMANN, MUELLER & LARSON, P.C.

(57) ABSTRACT

There is provided a semiconductor device that includes a wiring layer, a plurality of bonding layers arranged on the wiring layer and having conductivity, and a semiconductor element having a rear surface facing the wiring layer and a plurality of pads provided on the rear surface, and bonded to the wiring layer via the plurality of bonding layers, wherein the plurality of bonding layers are arranged in a grid shape when viewed along a thickness direction, wherein each of the plurality of pads is electrically connected to a circuit formed inside the semiconductor element and any of the plurality of bonding layers, and wherein at least one of the plurality of pads is located to be spaced apart from the plurality of bonding layers when viewed along the thickness direction.

15 Claims, 22 Drawing Sheets

(51) Int. Cl.
*H01L 23/31* (2006.01)
*H01L 25/16* (2023.01)

(52) U.S. Cl.
CPC .............. *H01L 24/16* (2013.01); *H01L 25/16* (2013.01); *H01L 2224/0401* (2013.01); *H01L 2224/16227* (2013.01)

(58) Field of Classification Search
USPC ........................................................ 257/688
See application file for complete search history.

(56) References Cited

U.S. PATENT DOCUMENTS

| | | | | |
|---|---|---|---|---|
| 2009/0294958 | A1* | 12/2009 | Hu | H01L 24/12 |
| | | | | 257/737 |
| 2015/0076690 | A1* | 3/2015 | Yoshino | H01L 23/49541 |
| | | | | 257/737 |
| 2016/0300799 | A1* | 10/2016 | Han | H01L 23/49838 |
| 2017/0025361 | A1* | 1/2017 | Lee | H01L 23/00 |
| 2017/0092609 | A1* | 3/2017 | Yajima | H01L 24/16 |
| 2017/0110339 | A1* | 4/2017 | Yow | H01L 24/92 |
| 2018/0138116 | A1* | 5/2018 | Lin | H01L 25/0652 |

\* cited by examiner

SEMICONDUCTOR DEVICE FOR REDUCING CONCENTRATION OF THERMAL STRESS ACTING ON BONDING LAYERS

CROSS-REFERENCE TO RELATED APPLICATION

This application is based upon and claims the benefit of priority from Japanese Patent Application No. 2019-154361, filed on Aug. 27, 2019, the entire contents of which are incorporated herein by reference.

TECHNICAL FIELD

The present disclosure relates to a semiconductor device including a flip-chip mounting type semiconductor element.

BACKGROUND

Related art discloses an example of a semiconductor device including a flip-chip mounting type semiconductor element. In the flip-chip mounting type semiconductor element, a plurality of pads provided on a rear surface is bonded to a wiring layer individually via a plurality of bonding layers such as solder bumps.

When bonding the flip-chip mounting type semiconductor element to the wiring layer, it is common that the plurality of bonding layers are individually arranged with respect to the plurality of pads of the semiconductor element. Therefore, the plurality of bonding layers are arranged to correspond to the arrangement distribution of the plurality of pads.

In the related art, when the arrangement distribution of the plurality of pads is non-uniform, the arrangement distribution of the plurality of bonding layers also becomes correspondingly non-uniform. Here, when the semiconductor device is used, thermal stress, which is caused by heat generated from the semiconductor element and a change in the outside air temperature, acts on the plurality of bonding layers. When the arrangement distribution of the plurality of bonding layers is non-uniform, it causes a difference in thermal stress acting on each of the plurality of bonding layers. The coarser the arrangement distribution of the plurality of bonding layers is, the more the thermal stress is concentrated. If the concentration of the thermal stress acting on the plurality of bonding layers becomes excessive, cracks may occur in at least one of the plurality of bonding layers. When a crack occurs in the bonding layer, there is a concern that conduction between the semiconductor element and the wiring layer may be hindered. Therefore, there is a need for a measure to reduce the concentration of thermal stress acting on the plurality of bonding layers.

SUMMARY

Some embodiments of the present disclosure provide a semiconductor device capable of reducing the concentration of thermal stress acting on a plurality of bonding layers interposed between a wiring layer and a semiconductor element.

According to one embodiment of the present disclosure, there is provided a semiconductor device that includes a wiring layer, a plurality of bonding layers arranged on the wiring layer and having conductivity, and a semiconductor element having a rear surface facing the wiring layer and a plurality of pads provided on the rear surface, and bonded to the wiring layer via the plurality of bonding layers, the plurality of bonding layers are arranged in a grid shape when viewed along a thickness direction, each of the plurality of pads is electrically connected to a circuit formed inside the semiconductor element and any of the plurality of bonding layers, and at least one of the plurality of pads is located to be spaced apart from the plurality of bonding layers when viewed along the thickness direction.

According to one embodiment of the present disclosure, the plurality of bonding layers overlaps the semiconductor element when viewed along the thickness direction.

According to one embodiment of the present disclosure, the semiconductor element includes an insulating film, which is arranged on the rear surface and exposes a portion of each of the plurality of pads, and a rewiring provided on the insulating film, and the rewiring is connected to at least one of the plurality of pads and is bonded to the wiring layer via at least one of the plurality of bonding layers.

According to one embodiment of the present disclosure, the rewiring includes a main body layer and a plurality of bump layers, wherein the main body layer is in contact with both sides of at least one of the plurality of pads and the insulating film, the plurality of bump layers protrudes from the main body layer in the thickness direction, and each of the plurality of bump layers is bonded to the wiring layer via any of the plurality of bonding layers.

According to one embodiment of the present disclosure, a size of an outline of each of the plurality of bonding layers gradually increases from a center of the semiconductor element toward a peripheral edge of the semiconductor element when viewed along the thickness direction.

According to one embodiment of the present disclosure, the semiconductor element includes a dummy pad provided on the insulating layer and electrically insulated from the circuit, and the dummy pad is bonded to the wiring layer via any of the plurality of bonding layers.

According to one embodiment of the present disclosure, the dummy pad faces any of the plurality of bonding layers, which is located on an outermost periphery with respect to a center of the semiconductor element when viewed along the thickness direction.

According to one embodiment of the present disclosure, the dummy pad faces any of four bonding layers located at four corners among the plurality of bonding layers when viewed in the thickness direction.

According to one embodiment of the present disclosure, an insulating layer having a main surface facing the rear surface is further includes, the insulating layer is located on a side opposite to the semiconductor element with respect to the wiring layer in the thickness direction, the wiring layer has a plurality of main body portions arranged on the main surface, and each of the plurality of bonding layers is arranged on any of the plurality of main body portions.

According to one embodiment of the present disclosure, the wiring layer includes a plurality of bump portions protruding in the thickness direction from any of the plurality of main body portions, and the plurality of bonding layers are individually arranged with respect to the plurality of bump portions.

According to one embodiment of the present disclosure, the insulating layer has a plurality of penetrating portions penetrating from the main surface in the thickness direction, the wiring layer has a plurality of base portions which includes portions individually accommodated in the plurality of penetrating portions, any of the plurality of base portions being bonded to any of the plurality of main body portions, and each of the plurality of base portions faces a side opposite to the main surface in the thickness direction and has a bottom surface exposed from any of the plurality of penetrating portions.

According to one embodiment of the present disclosure, a plurality of terminals is further included, and the plurality of terminals individually cover bottom surfaces of the plurality of base portions.

According to one embodiment of the present disclosure, each of the plurality of base portions has a side surface that is connected to a bottom surface of any of the plurality of base portions and faces a direction orthogonal to the thickness direction, and the side surface of each of the plurality of base portions includes an exposed portion exposed from any of the plurality of penetrating portions.

According to one embodiment of the present disclosure, each of the plurality of terminals has a bottom portion that covers a bottom surface of any of the plurality of base portions, and a side portion that covers the exposed portion of any of the plurality of base portions, which is connected to the bottom portion.

According to one embodiment of the present disclosure, a plurality of electronic components is further includes, each of the plurality of electronic components includes a pair of electrodes located to be spaced apart from each other, and the pair of electrodes in each of the plurality of electronic components is bonded to the wiring layer in a state where conduction with the wiring layer is secured.

According to one embodiment of the present disclosure, the wiring layer has a plurality of pedestal portions protruding from any of the plurality of main body portions in the thickness direction, and the pair of electrodes in each of the plurality of electronic components is individually bonded to two adjacent pedestal portions among the plurality of pedestal portions.

According to one embodiment of the present disclosure, a sealing resin is further included, and the sealing resin is in contact with both sides of the main surface and the wiring layer and covers the semiconductor element and the plurality of electronic components.

Other features and advantages of the present disclosure will be more apparent from the detailed description given below with reference to the accompanying drawings.

DETAILED DESCRIPTION

A mode for carrying out the present disclosure will be described with reference to the accompanying drawings.

First Embodiment

Figure 1:
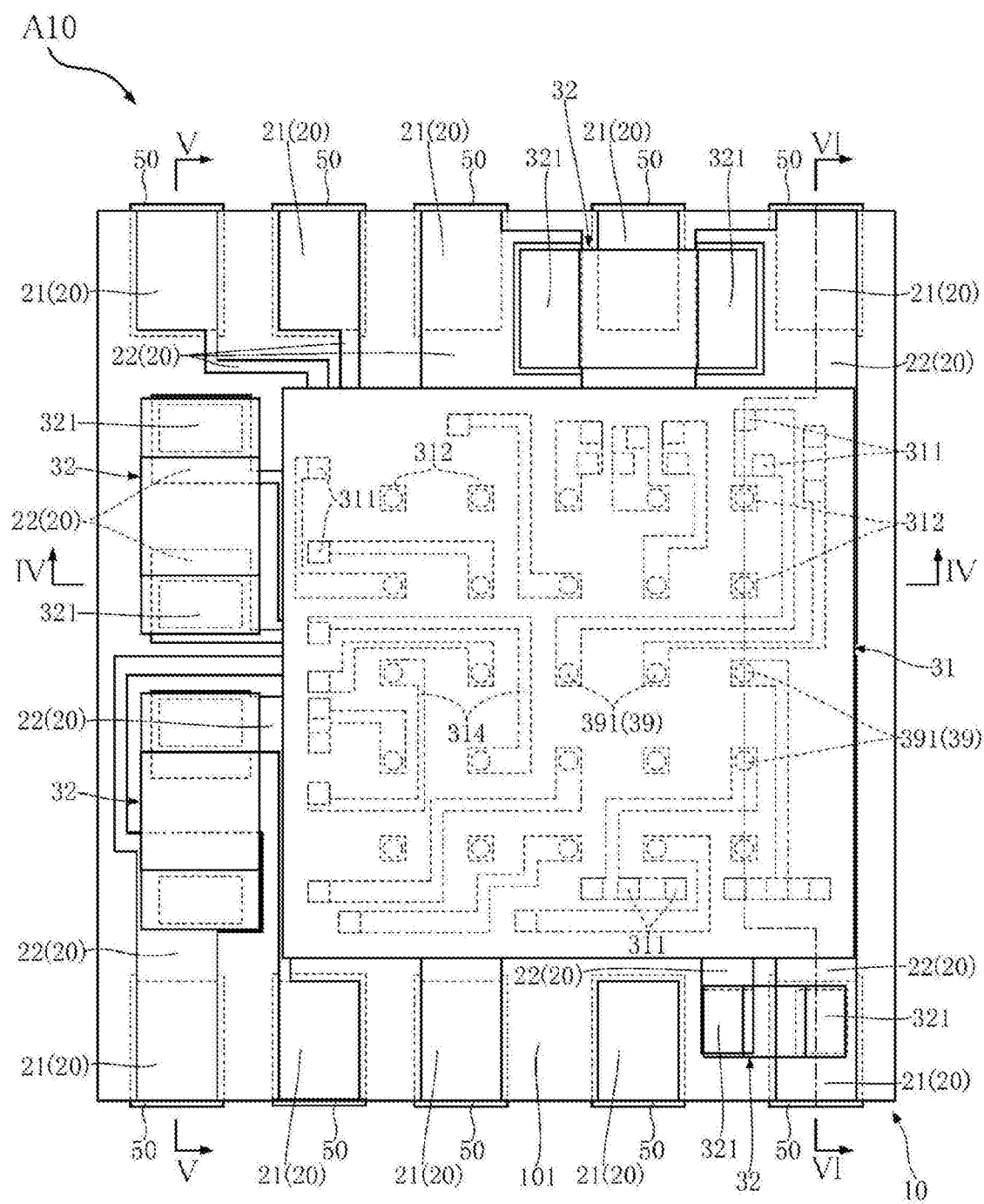
FIG. 1 is a plan view of a semiconductor device according to a first embodiment of the present disclosure, in which a sealing resin is illustrated to be transparent.
Figure 2:
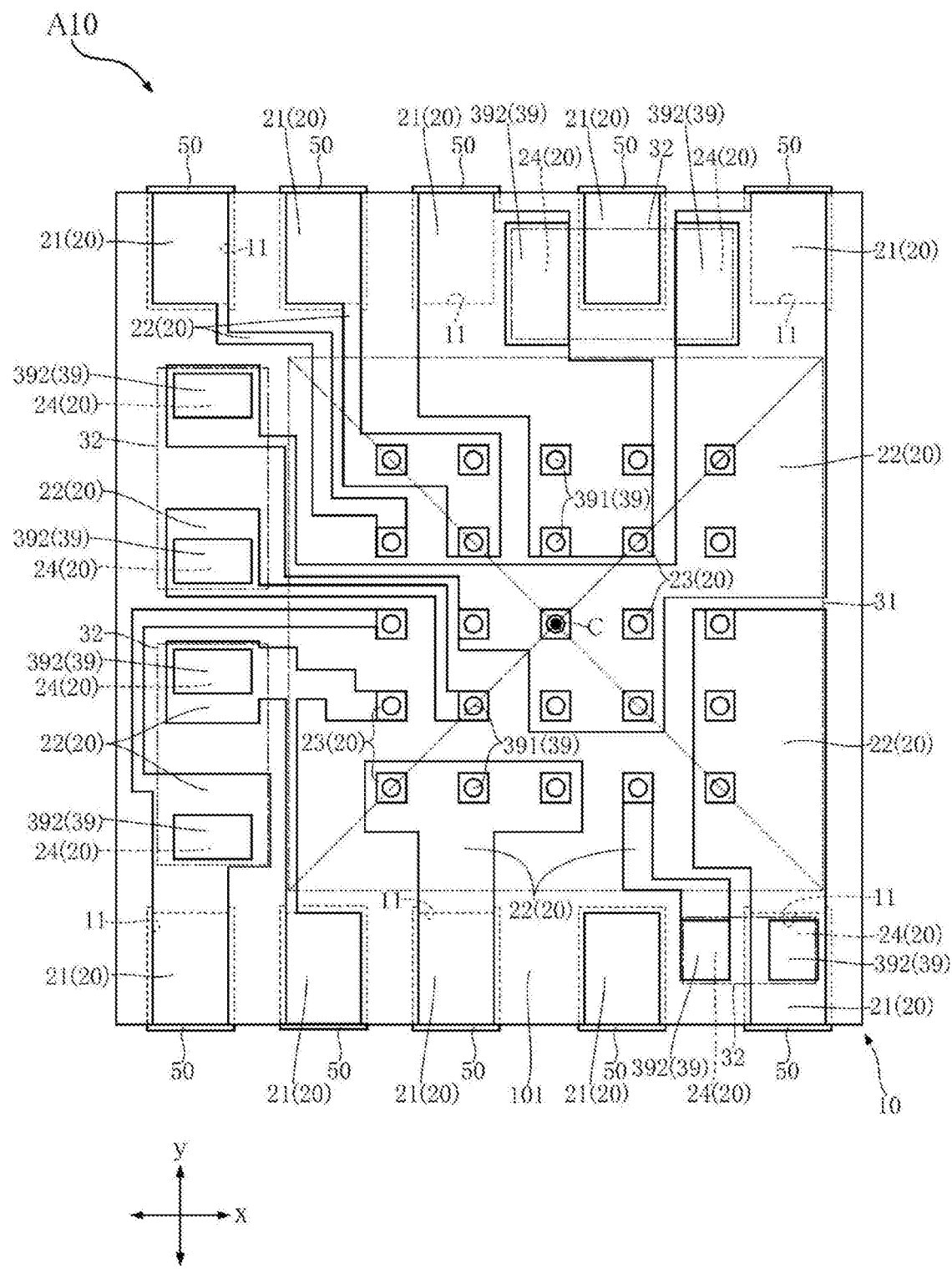
FIG. 2 is a plan view corresponding to FIG. 1, in which a semiconductor element, a plurality of electronic components, and a sealing resin are illustrated to be transparent.

A semiconductor device A10 according to a first embodiment of the present disclosure will be described with reference to FIGS. 1 to 13. The semiconductor device A10 includes an insulating layer 10, a wiring layer 20, a plurality of bonding layers 39, a semiconductor element 31, a plurality of electronic components 32, a sealing resin 40, and a plurality of terminals 50. The semiconductor device A10 is of a resin package type which is surface-mounted on a wiring board. Here, for convenience of understanding, in FIG. 1, the sealing resin 40 is illustrated to be transparent. For convenience of understanding, in FIG. 2, the semiconductor element 31 and the electronic components 32 are illustrated to be further transparent with respect to FIG. 1. In FIG. 2, the transparent semiconductor element 31 and electronic components 32 are shown by imaginary lines (two-dot chain lines).

In the descriptions of the semiconductor device A10, a thickness direction of the wiring layer 20 is referred to as a "thickness direction z" for the sake of convenience. A direction orthogonal to the thickness direction z is referred to as a "first direction x." A direction orthogonal to both the thickness direction z and the first direction x is referred to as a "second direction y." As shown in FIG. 1, the semiconductor device A10 has a rectangular shape when viewed along the thickness direction z.

As shown in FIGS. 1 to 6, the wiring layer 20 is arranged on the insulating layer 10. The insulating layer 10 is located on a side opposite to the semiconductor element 31 with respect to the wiring layer 20 in the thickness direction z. The insulating layer 10 is made of a material containing polyimide. As other materials of the insulating layer 10, a material containing an organic compound as a main material, such as a material containing polybenzoxazole (PBO), a material containing a phenol resin, a material containing polyamide and an epoxy resin, or the like, can be adopted. The insulating layer 10 has a main surface 101, a rear surface 102, and a plurality of penetrating portions 11.

Figure 4:
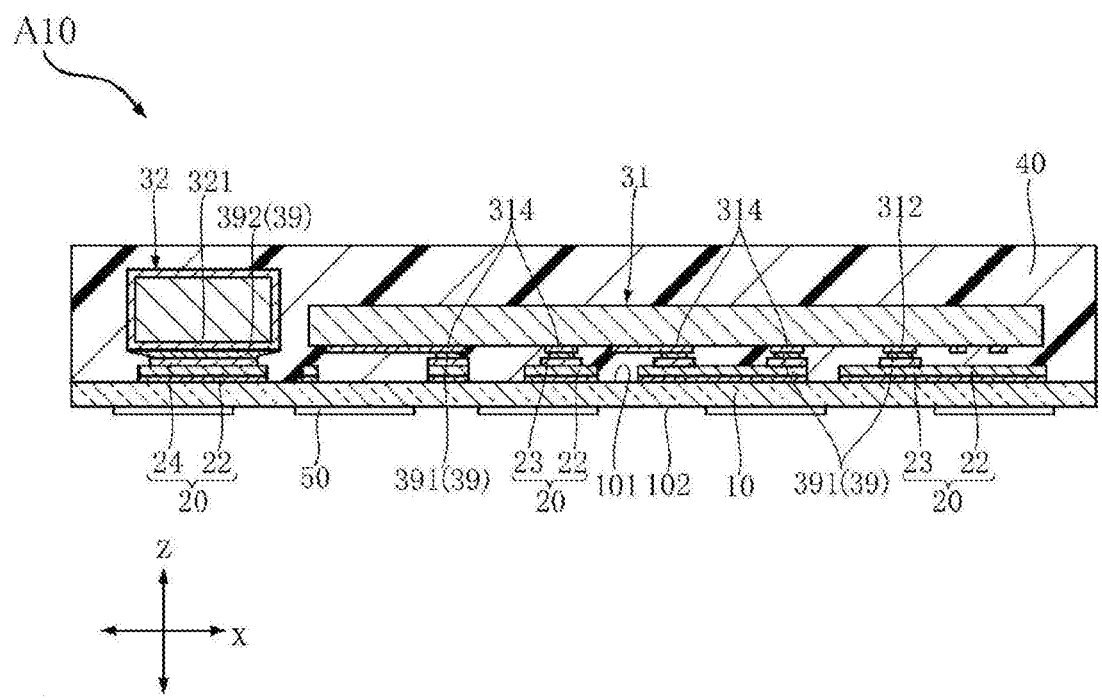
FIG. 4 is a cross-sectional view taken along line IV-IV in FIG. 1.
Figure 5:
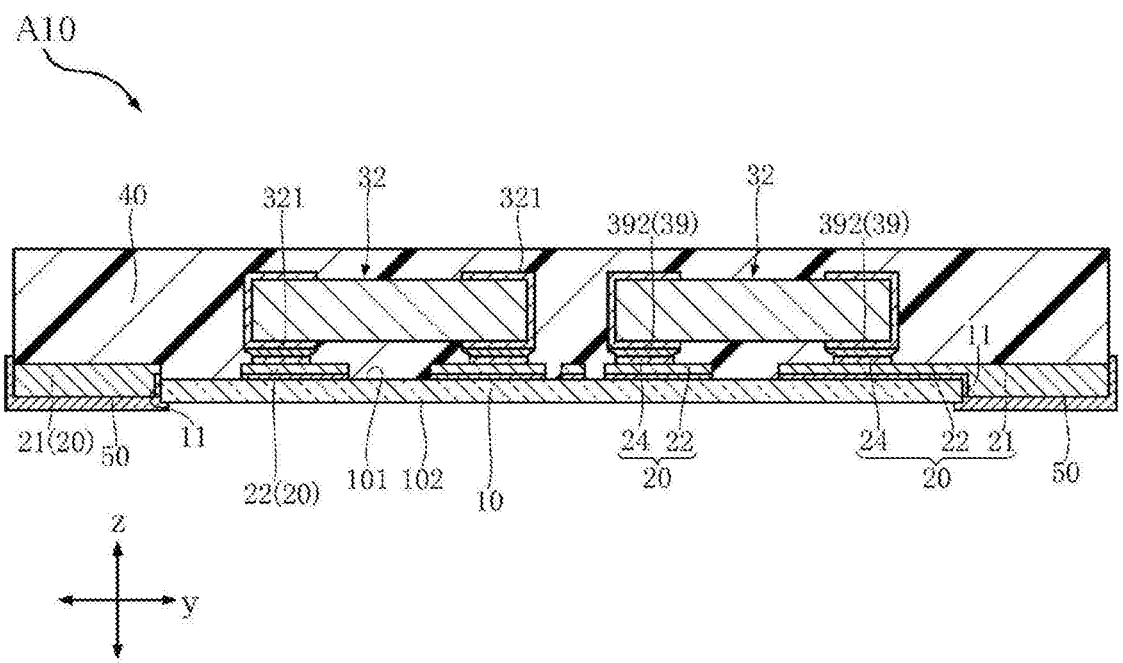
FIG. 5 is a cross-sectional view taken along line V-V in FIG. 1.
Figure 6:
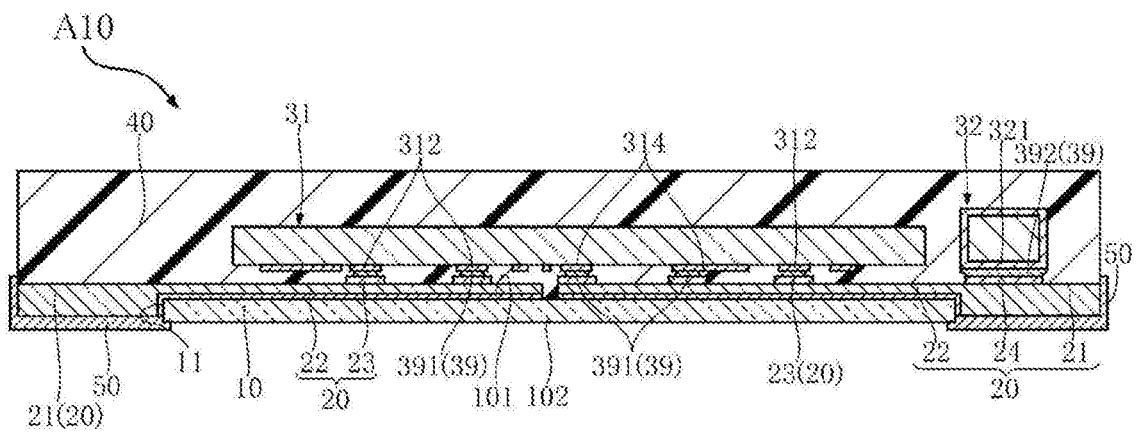
FIG. 6 is a cross-sectional view taken along line VI-VI in FIG. 1.

As shown in FIGS. 4 to 6, the main surface 101 and the rear surface 102 face opposite sides in the thickness direction z. The main surface 101 faces the semiconductor element 31 and the electronic components 32. The rear surface 102 is exposed to an outside of the semiconductor device A10 and faces a target wiring board when the semiconductor device A10 is mounted. The penetrating portions 11 penetrate the insulating layer 10 in the thickness direction z from the main surface 101 to the rear surface 102. In the semiconductor device A10, one side of each of the penetrating portions 11 in the second directions y is opened.

Figure 3:
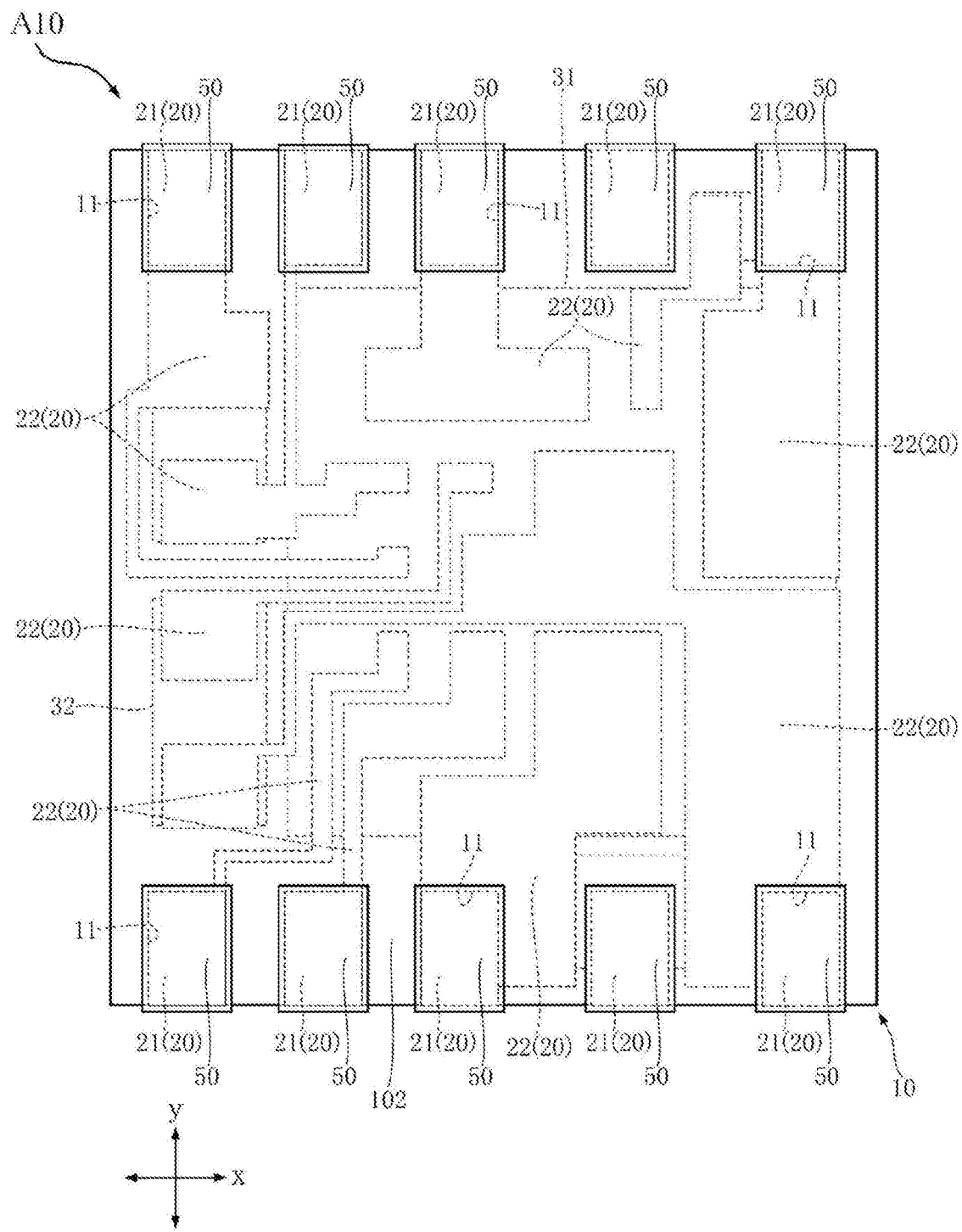
FIG. 3 is a bottom view of the semiconductor device shown in FIG. 1.
Figure 7:
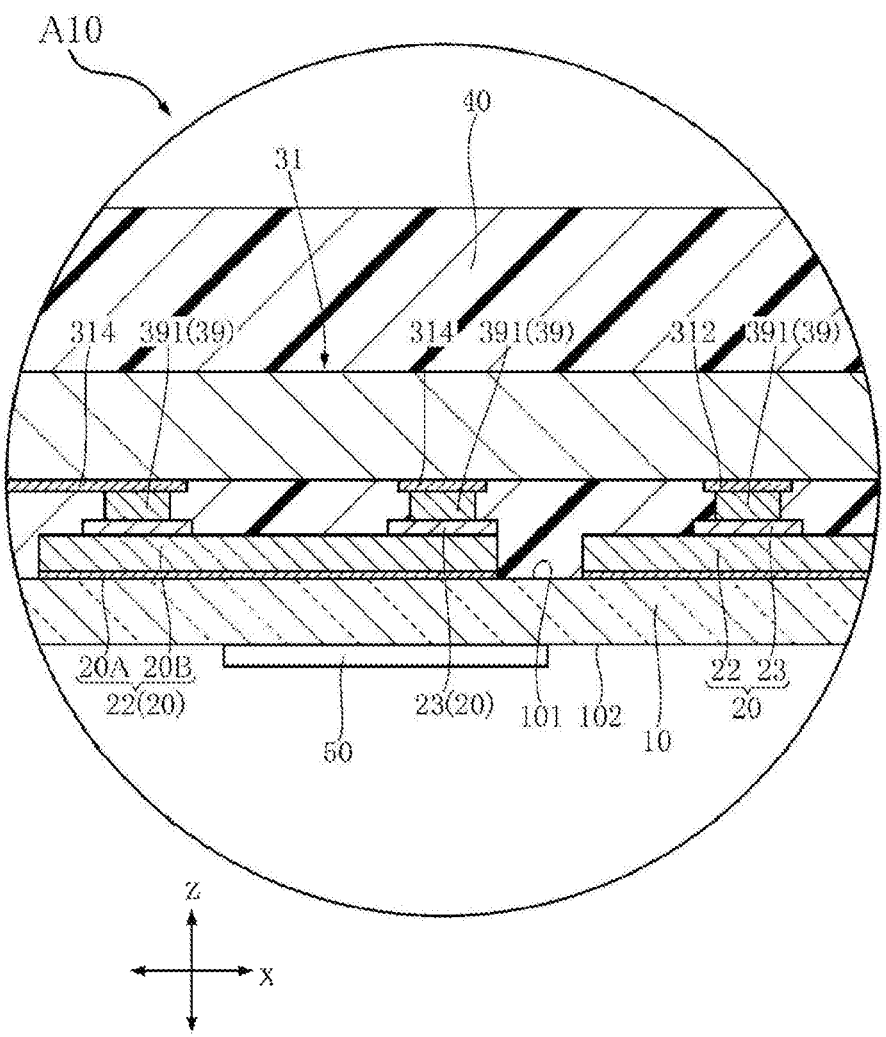
FIG. 7 is a partially enlarged view of FIG. 4.
Figure 8:
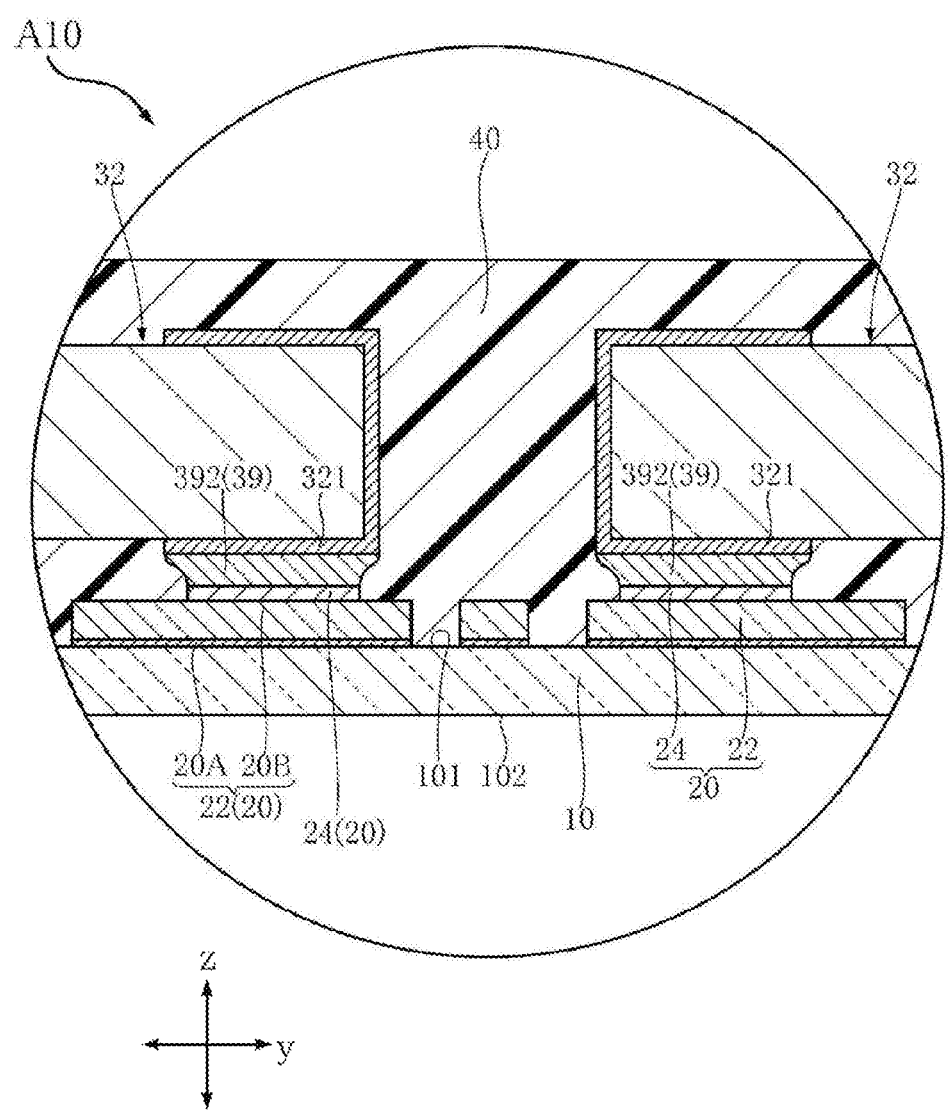
FIG. 8 is a partially enlarged view of FIG. 5.
Figure 9:
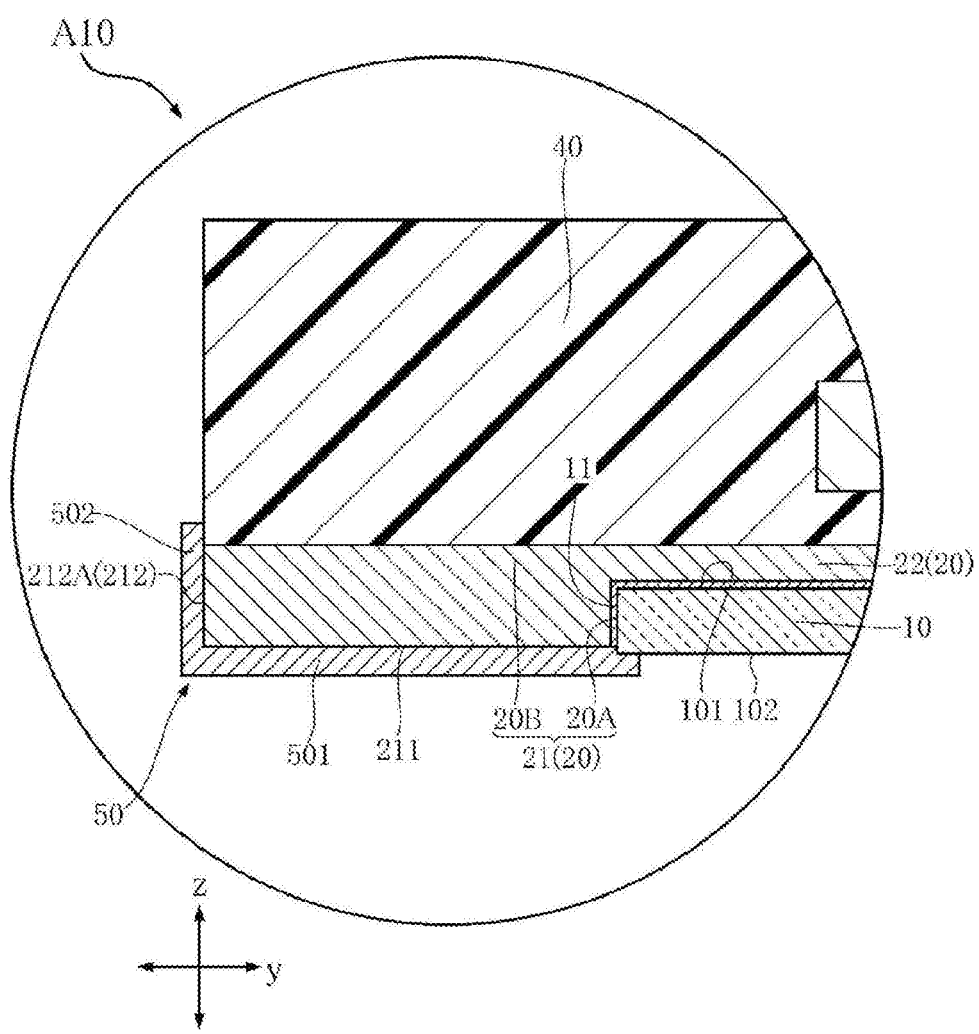
FIG. 9 is a partially enlarged view of FIG. 6.

The wiring layer 20 is arranged on the main surface 101 of the insulating layer 10 and the penetrating portions 11 of the insulating layer 10, as shown in FIGS. 2 to 6 (excluding FIG. 3). The wiring layer 20 constitutes a portion of a conductive path between the semiconductor element 31, the electronic components 32, and the wiring board on which the semiconductor device A10 is mounted. As shown in FIGS. 7 to 9, the wiring layer 20 includes a base layer 20A and a main body layer 20B.

The base layer 20A is in contact with the insulating layer 10. A portion of the base layer 20A is accommodated in each of the plurality of penetrating portions 11 of the insulating layer 10. The base layer 20A includes a barrier layer in contact with the insulating layer 10, and a seed layer stacked on the barrier layer. The composition of the barrier layer includes titanium (Ti). The composition of the seed layer includes copper (Cu). The main body layer 20B is stacked on the base layer 20A. A portion of the main body layer 20B is accommodated in each of the plurality of penetrating portions 11. In the wiring layer 20, the main body layer 20B serves as a main conductive path. The composition of the main body layer 20B is the same as the composition of the seed layer of the base layer 20A. Therefore, the composition of the main body layer 20B includes copper.

As shown in FIGS. 2, 5, and 6, the wiring layer 20 includes a plurality of base portions 21, a plurality of main body portions 22, a plurality of bump portions 23, and a plurality of pedestal portions 24. Among them, the plurality of base portions 21 and the plurality of main body portions 22 are composed of the base layer 20A and the main body layer 20B, as shown in FIGS. 7 to 9.

As shown in FIGS. 2, 5, and 6, the plurality of base portions 21 include portions individually accommodated in the penetrating portions 11 of the insulating layer 10, and portions protruding from the main surface 101 of the insulating layer 10 in the thickness direction z. When viewed along the thickness direction z, a shape and size of each of the base portions 21 are equal to a shape and size of any of the penetrating portions 11 in which a portion of the plurality of base portions 21 is accommodated. As shown in FIG. 9, each of the plurality of base portions 21 has a bottom surface 211 and a side surface 212. The bottom surface 211 faces a side opposite to the main surface 101 in the thickness direction z and is exposed from any of the plurality of penetrating portions 11. The bottom surface 211 is located closer to the main surface 101 than the rear surface 102 of the insulating layer 10 in the thickness direction z. The side surface 212 is connected to one of the bottom surfaces 211 of the base portions 21 and faces directions (the first direction x and the second direction y in the semiconductor device A10) orthogonal to the thickness direction z. The side surface 212 is in contact with a surface of the insulating layer 10 which defines any of the penetrating portions 11. The side surface 212 of each of the plurality of base portions 21 includes an exposed portion 212A that is exposed from a portion where one side of any of the penetrating portions 11 in the second directions y is opened.

As shown in FIGS. 2 to 6 (excluding FIG. 3), the plurality of main body portions 22 are arranged on the main surface 101 of the insulating layer 10. Some of the plurality of main body portions 22 are connected to any of the plurality of base portions 21.

As shown in FIGS. 2, 4, 6, and 7, each of the plurality of bump portions 23 protrudes in the thickness direction z from any of the plurality of main body portions 22. In the semiconductor device A10, each of the plurality of bump portions 23 is formed of a copper layer stacked on any of the plurality of main body portions 22. Note that this configuration is an example, and each of the plurality of bump portions 23 may be interposed between any of the plurality of main body portions 22 and the copper layer, and may include a metal thin film containing titanium and copper in its composition. As shown in FIG. 2, when viewed in the thickness direction z, the plurality of bump portions 23 is arranged in a grid pattern. Each of the plurality of bump portions 23 has a rectangular shape when viewed along the thickness direction z.

As shown in FIGS. 2 to 8 (excluding FIGS. 3 and 7), each of the plurality of pedestal portions 24 protrudes in the thickness direction z from any of the plurality of base portions 21 and the plurality of main body portions 22. In the semiconductor device A10, each of the plurality of pedestal portions 24 includes a copper layer stacked on any of the plurality of base portions 21 and the plurality of main body portions 22. Note that this configuration is an example, and each of the plurality of pedestal portions 24 may be interposed between the copper layer and any of the plurality of base portions 21 and the plurality of main body portions 22, and may include a metal thin film containing titanium and copper in its composition. As shown in FIG. 2, each of the plurality of pedestal portions 24 has a rectangular shape when viewed along the thickness direction z. When viewed along the thickness direction z, an area of each of the plurality of pedestal portions 24 is larger than an area of each of the plurality of bump portions 23.

As shown in FIGS. 2 to 8 (excluding FIG. 3), the plurality of bonding layers 39 is individually arranged with respect to the plurality of bump portions 23 of the wiring layer 20 and the plurality of pedestal portions 24 of the wiring layer 20. Therefore, the plurality of bonding layers 39 is arranged on the wiring layer 20. The plurality of bonding layers 39 has conductivity. In the semiconductor device A10, each of the plurality of bonding layers 39 includes a nickel (Ni) layer, which is stacked on any of the plurality of bump portions 23 and the plurality of pedestal portions 24, and an alloy layer, which is stacked on the nickel layer and contains tin (Sn) in its composition. Note that this configuration is an example, and each of the plurality of bonding layers 39 may be interposed between the nickel layer and any of the plurality of bump portions 23 and the plurality of pedestal portions 24, and may include a metal thin film containing titanium and copper in its composition.

As shown in FIGS. 2, 4, and 6, the plurality of bonding layers 39 include a plurality of first bonding layers 391 and a plurality of second bonding layers 392. The plurality of first bonding layers 391 is individually arranged with respect to the plurality of bump portions 23 of the wiring layer 20. Therefore, each of the plurality of first bonding layers 391 is arranged on any of the plurality of main body portions 22 of the wiring layer 20. As shown in FIG. 2, the plurality of first bonding layers 391 is arranged in a grid pattern when viewed along the thickness direction z. Each of the plurality of bump portions 23 has a circular shape when viewed along the thickness direction z. In the semiconductor device A10, a size of an outline of each of the plurality of first bonding layers 391 is substantially equal to each other when viewed along the thickness direction z. The plurality of second bonding layers 392 is individually arranged with respect to the plurality of pedestal portions 24 of the wiring layer 20.

As shown in FIGS. 4 to 7 (excluding FIG. 5), the semiconductor element 31 is bonded to the plurality of bump portions 23 of the wiring layer 20 via the plurality of first bonding layers 391. The semiconductor element 31 faces the main surface 101 of the insulating layer 10 and the wiring layer 20. The semiconductor element 31 is a flip-chip mounting type element. In the semiconductor device A10, the semiconductor element 31 is an LSI.

Figure 10:
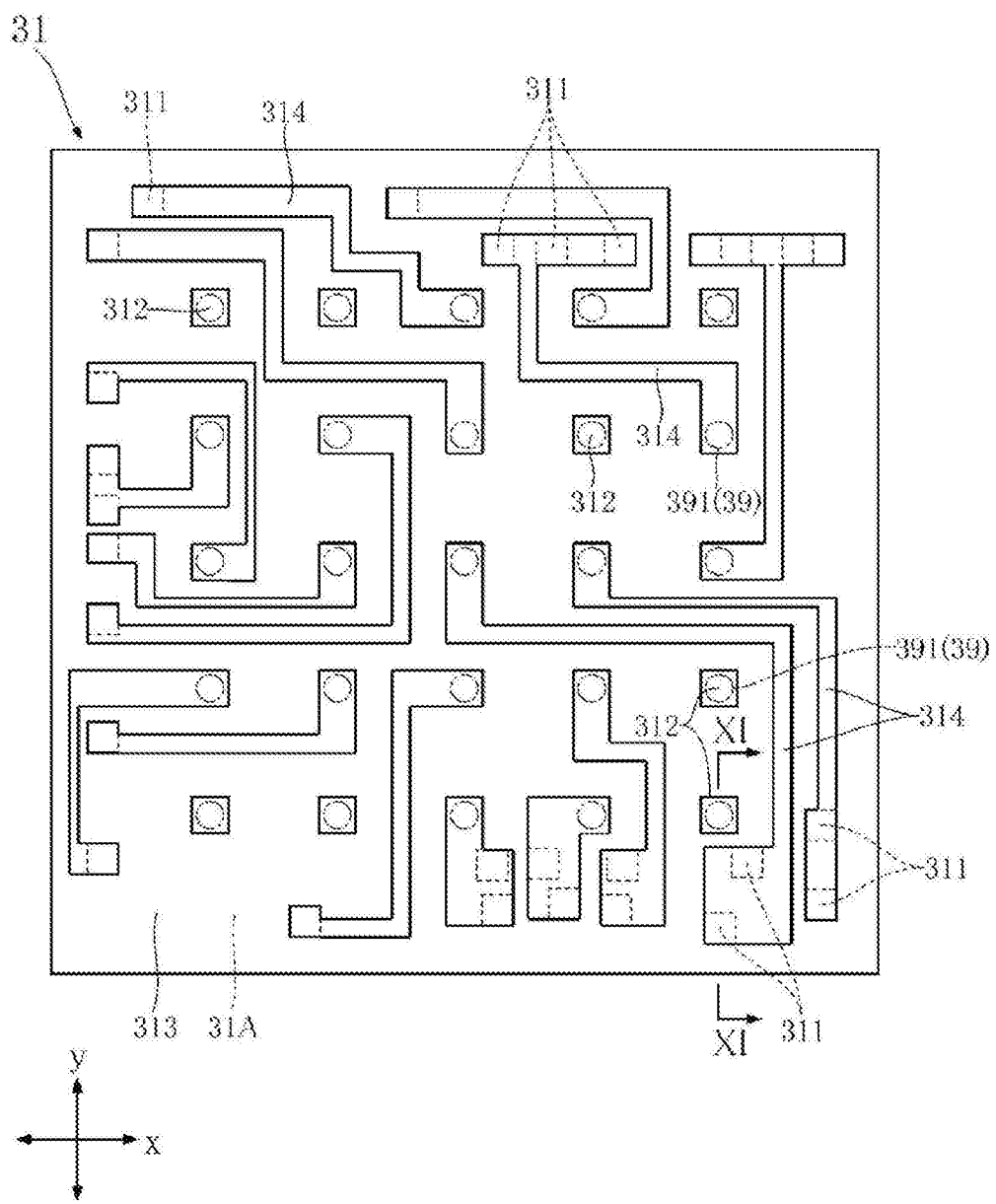
FIG. 10 is a bottom view of a semiconductor element constituting the semiconductor device shown in FIG. 1.
Figure 11:
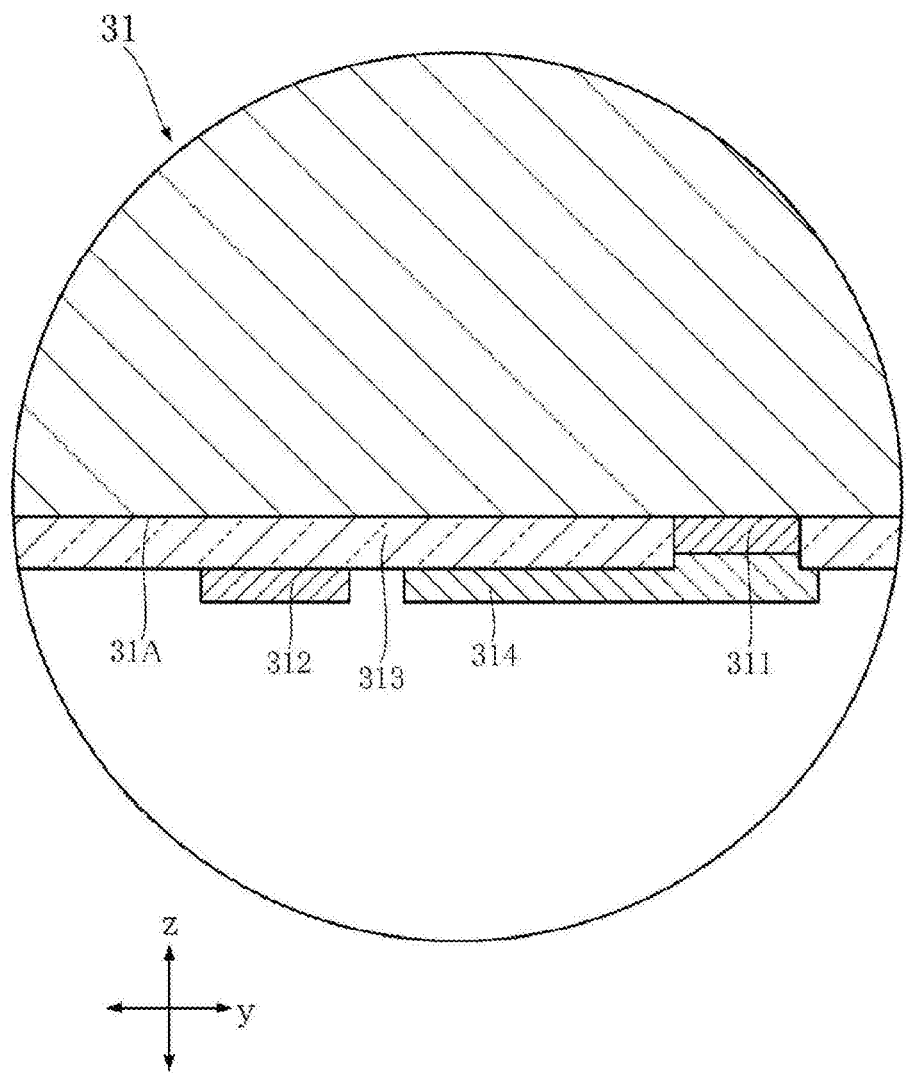
FIG. 11 is a partially enlarged cross-sectional view taken along line XI-XI of FIG. 10.

As shown in FIGS. 10 and 11, the semiconductor element 31 has a rear surface 31A, a plurality of pads 311, a plurality of dummy pads 312, an insulating film 313, and a rewiring 314. The rear surface 31A faces the main surface 101 of the insulating layer 10 and the wiring layer 20. The plurality of pads 311 is provided on the rear surface 31A. Each of the plurality of pads 311 is electrically connected to a circuit (not shown) formed inside the semiconductor element 31. The plurality of dummy pads 312 are provided on the insulating film 313. Unlike the plurality of pads 311, each of the plurality of dummy pads 312 is electrically insulated from the circuit. The insulating film 313 is arranged on the rear surface 31A. A portion of each of the plurality of pads 311 and the plurality of dummy pads 312 is exposed from the insulating film 313. An example of a material of the insulating film 313 may include a material containing polyimide or polybenzoxazole. The rewiring 314 is provided on the insulating film 313. The rewiring 314 is connected to at least one of the plurality of pads 311. The rewiring 314 is located to be spaced apart from the plurality of dummy pads 312. The composition of the rewiring 314 includes copper.

As shown in FIGS. 4 to 7 (excluding FIG. 5), the rewiring 314 is connected to at least one of the plurality of bump portions 23 of the wiring layer 20 via at least one of the plurality of first bonding layers 391. As a result, each of the plurality of pads 311 is electrically connected to both of any of the plurality of first bonding layers 391 and any of the plurality of bump portions 23 on which the plurality of first bonding layer 391 is arranged, via the rewiring 314. In the rewiring 314, a surface layer 314B is in contact with any of the plurality of first bonding layers 391.

Figure 12:
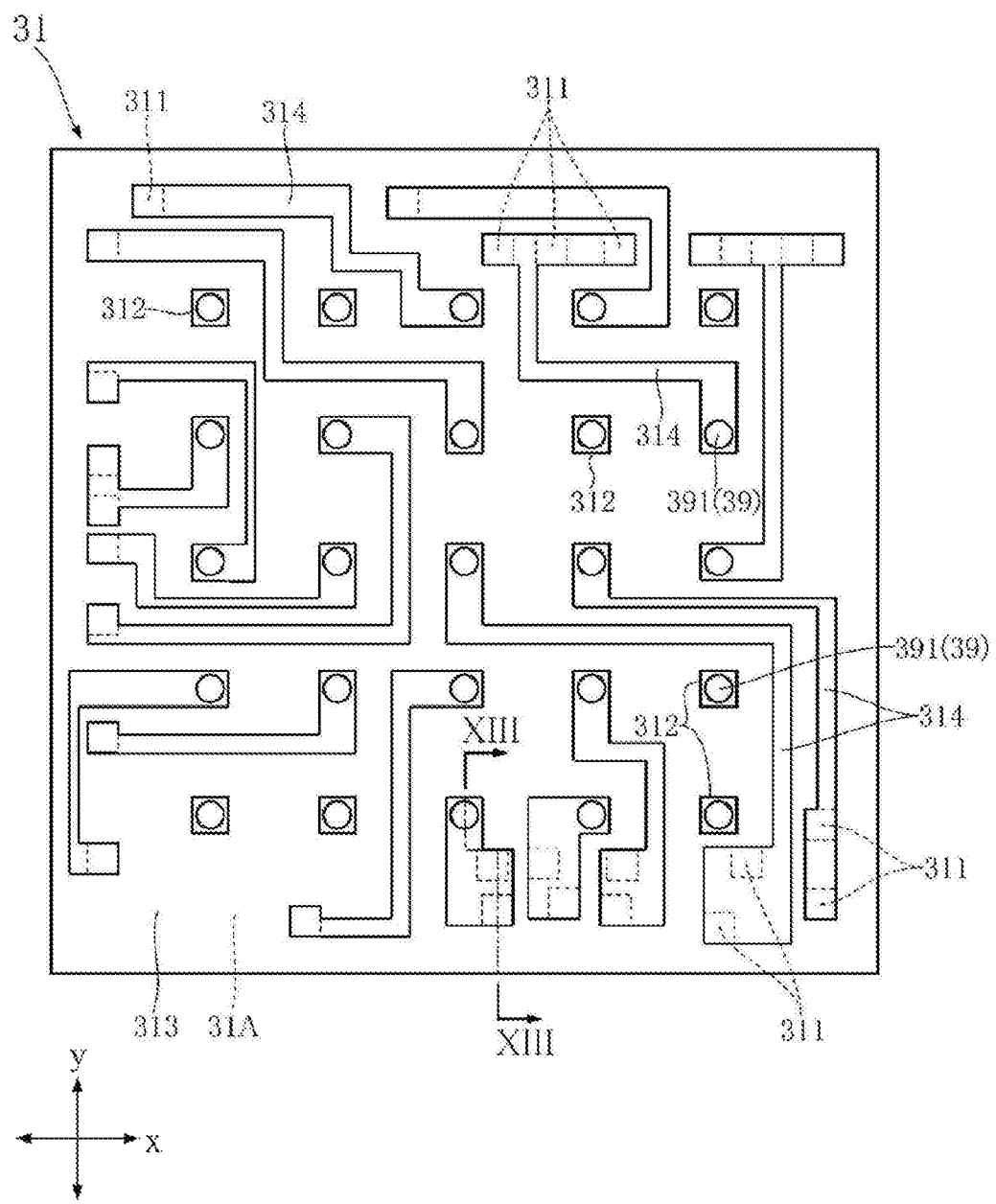
FIG. 12 is a bottom view of another example of the semiconductor element constituting the semiconductor device shown in FIG. 1.
Figure 13:
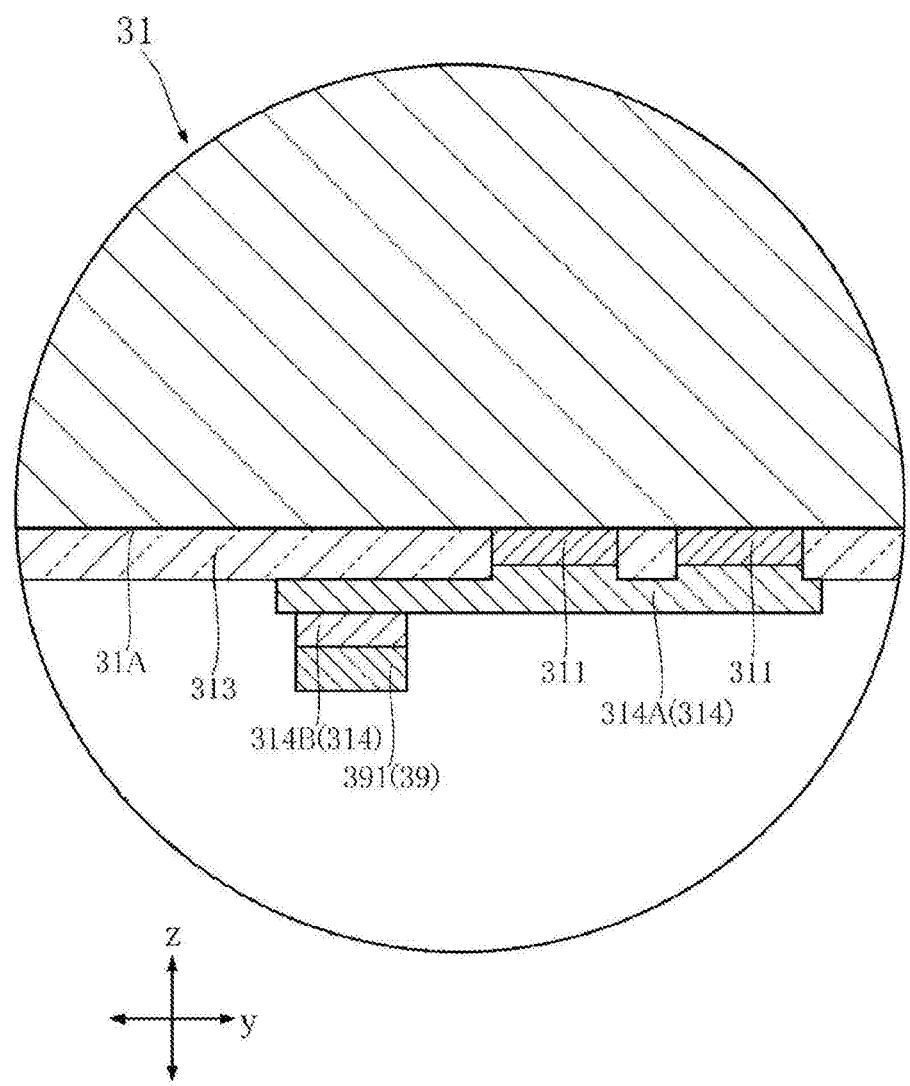
FIG. 13 is a partially enlarged cross-sectional view taken along line XIII-XIII in FIG. 12.

FIGS. 12 and 13 show another example of the semiconductor element 31. As shown in FIG. 13, the rewiring 314 includes a main body layer 314A and a plurality of bump layers 314B. The main body layer 314A is in contact with both sides of at least one of the plurality of pads 311 and the insulating film 313. The plurality of bump layers 314B protrudes from the main body layer 314A in the thickness direction z. The plurality of first bonding layers 391 is individually arranged on the plurality of bump layers 314B and the plurality of dummy pads 312 (see FIGS. 12 and 13). The plurality of first bonding layers 391 is additionally arranged with respect to the plurality of first bonding layers 391, which is individually arranged with respect to the plurality of bump portions 23 of the wiring layer 20. Each of the plurality of bump layers 314B is bonded to at least one of the plurality of bump portions 23 of the wiring layer 20 via any of the first bonding layers 391.

As shown in FIG. 1, when viewed along the thickness direction z, at least one of the plurality of pads 311 is located to be spaced apart from the first bonding layers 391. When viewed along the thickness direction z, the plurality of first bonding layers 391 overlaps the semiconductor element 31.

As shown in FIGS. 4 to 7 (excluding FIG. 5), each of the plurality of dummy pads 312 is connected to any of the plurality of bump portions 23 of the wiring layer 20 via any of the plurality of first bonding layers 391. Therefore, each of the plurality of dummy pads 312 faces one of the plurality of first bonding layers 391. As shown in FIG. 1 and FIG. 2, any of the plurality of dummy pads 312 faces any of the plurality of first bonding layers 391, which is located at the outermost periphery with respect to the center C of the first bonding layers 391 when viewed along the thickness direction z (the intersection of the diagonal lines of the peripheral edges of the semiconductor element 31 when viewed along the thickness direction z). Any of the plurality of dummy pads 312 faces any of the four first bonding layers 391, which are located at the four corners, among the first bonding layers 391 when viewed in the thickness direction z. In the semiconductor device A10, the four corresponding dummy pads 312 among the dummy pads 312 individually face the four corresponding first bonding layers 391.

As shown in FIGS. 2 and 5, each of the plurality of electronic components 32 is mounted on two adjacent pedestal portions 24 among the plurality of pedestal portions 24 of the wiring layer 20. The plurality of electronic components 32 are a surface mounting type or a chip type. Each of the plurality of electronic components 32 corresponds to any one of a passive element such as a resistor, a capacitor and an inductor, and a diode. In the semiconductor device A10, when any of the plurality of electronic components 32 is a resistor, it is assumed as a thick film (metal glaze film) type resistor. In addition, when any of the plurality of electronic components 32 is a capacitor, it is assumed as a ceramic capacitor.

As shown in FIGS. 1 and 5, each of the plurality of electronic components 32 includes a pair of electrodes 321. The pair of electrodes 321 is located to be spaced apart from each other. As shown in FIG. 8, each of the pair of electrodes 321 in each of the plurality of electronic components 32 is bonded to any of the plurality of pedestal portions 24 of the wiring layer 20 via any of the plurality of second bonding layers 392. As a result, the pair of electrodes 321 in each of the plurality of electronic components 32 is individually bonded to the two adjacent pedestal portions 24 among the plurality of pedestal portions 24. Therefore, the pair of electrodes 321 in each of the plurality of electronic components 32 is in a state where electrical conduction with the wiring layer 20 is secured.

As shown in FIGS. 4 to 6, the sealing resin 40 is in contact with both of the main surface 101 of the insulating layer 10 and the wiring layer 20. The sealing resin 40 covers the semiconductor element 31 and the plurality of electronic components 32. The sealing resin 40 is made of an insulating material containing a black epoxy resin, for example.

As shown in FIGS. 3 to 6 (excluding FIG. 4), the plurality of terminals 50 individually cover the bottom surfaces 211 of the base portions 21 of the wiring layer 20. The plurality of terminals 50 is exposed to the outside of the semiconductor device A10. The semiconductor device A10 is mounted on the wiring board by bonding each of the plurality of terminals 50 to the wiring board via solder. In the semiconductor device A10, each of the plurality of terminals 50 includes a multi-layered metal layer in which a nickel layer, a palladium (Pd) layer, and a gold (Au) layer are sequentially stacked from the bottom surface 211 of any of the plurality of base portions 21. As another configuration, each of the plurality of terminals 50 may include a multi-layered metal layer in which a copper layer, a silver (Ag) layer, and a tin layer are sequentially stacked from the bottom surface 211 of any of the plurality of base portions 21.

As shown in FIG. 9, each of the plurality of terminals 50 has a bottom portion 501 and a side portion 502. The bottom portion 501 covers the bottom surface 211 of any of the plurality of base portions 21 of the wiring layer 20. The side portion 502 is connected to the bottom portion 501 of any of the plurality of terminals 50 and extends from the bottom portion 501 in the thickness direction z. Each of the side portions 502 of the plurality of terminals 50 covers the exposed portion 212A of any of the plurality of base portions 21 connected to the bottom surface 211.

Next, an example of a method of manufacturing the semiconductor device A10 will be described with reference to FIGS. 14 to 27. The cross-sectional positions of FIGS. 14 to 27 are the same as the cross-sectional position of FIG. 6.

Figure 14:
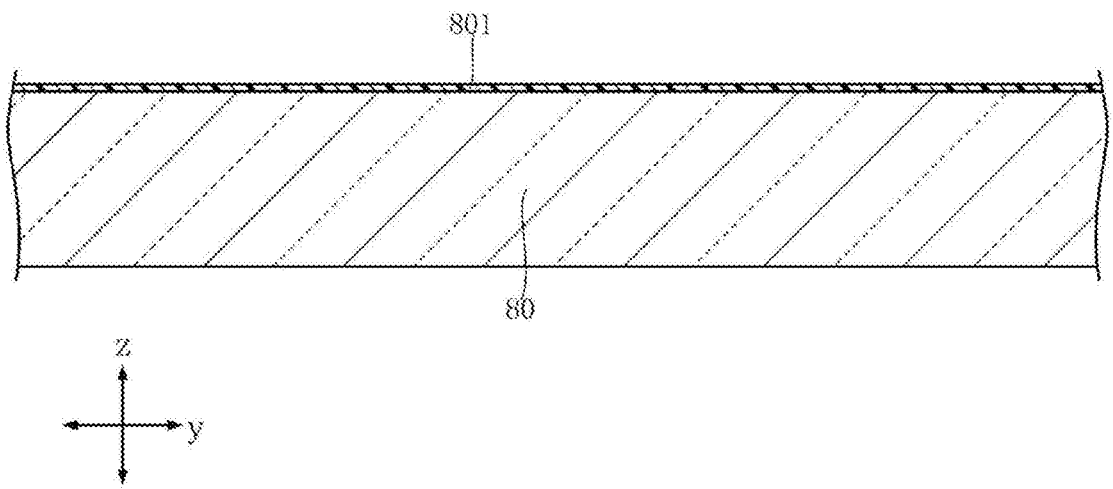
FIG. 14 is a cross-sectional view for explaining a process of manufacturing the semiconductor device shown in FIG. 1.

First, as shown in FIG. 14, a temporary fixing layer 801 is applied to the surface of a base material 80 on one side in the thickness direction z. The base material 80 is a glass plate. The base material 80 may be a silicon wafer other than a glass plate. The temporary fixing layer 801 is made of a material containing an organic compound.

Figure 15:
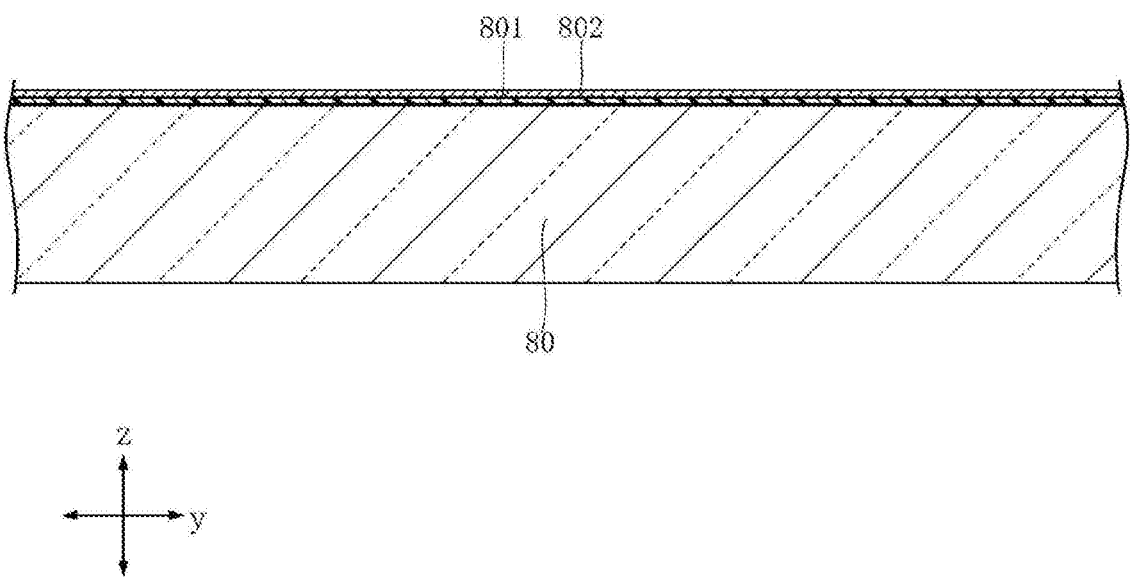
FIG. 15 is a cross-sectional view for explaining a process of manufacturing the semiconductor device shown in FIG. 1.

Next, as shown in FIG. 15, a peeling layer 802 that covers an entirety of the temporary fixing layer 801 is formed. The peeling layer 802 is in contact with the temporary fixing layer 801 and is formed of a first metal thin film made of titanium, and a second metal thin film stacked on the first metal thin film and made of copper. The peeling layer 802 is formed by forming each of these metal thin films by a sputtering method.

Figure 16:
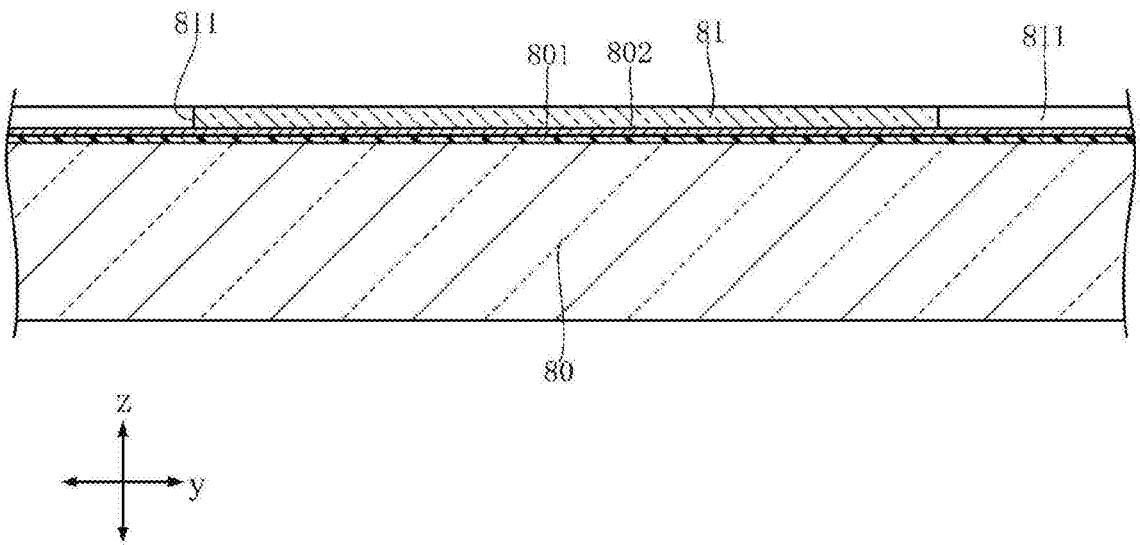
FIG. 16 is a cross-sectional view for explaining a process of manufacturing the semiconductor device shown in FIG. 1.

Next, as shown in FIG. 16, an insulating layer 81 that covers the peeling layer 802 is formed. The insulating layer 81 has a plurality of penetrating portions 811 penetrating therethrough in the thickness direction z. The insulating layer 81 is made of a material containing photosensitive polyimide. The insulating layer 81 is formed by applying the material to an entirety of the peeling layer 802 by using a spin coater or the like and then performing lithographic patterning with respect to the material. As a result, the plurality of penetrating portions 811 is formed in the insulating layer 81. A portion of the peeling layer 802 is exposed from the plurality of penetrating portions 811.

Figure 17:
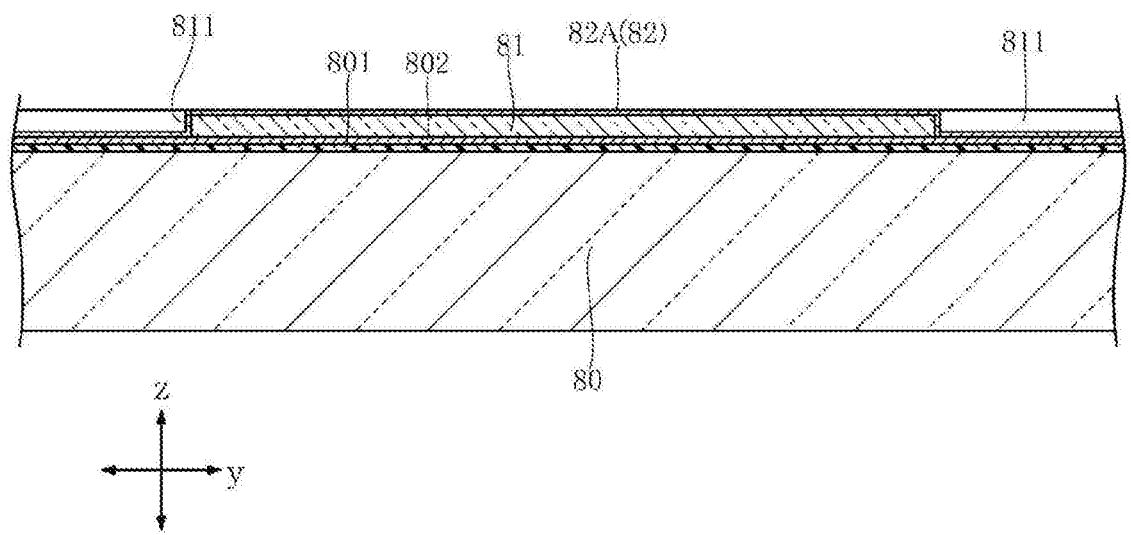
FIG. 17 is a cross-sectional view for explaining a process of manufacturing the semiconductor device shown in FIG. 1.
Figure 18:
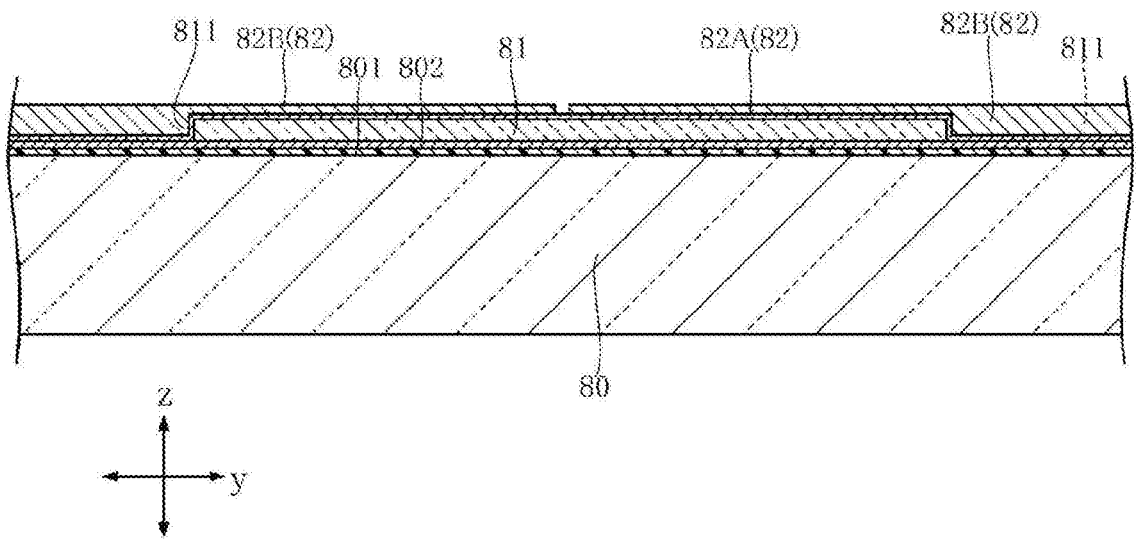
FIG. 18 is a cross-sectional view for explaining a process of manufacturing the semiconductor device shown in FIG. 1.
Figure 19:
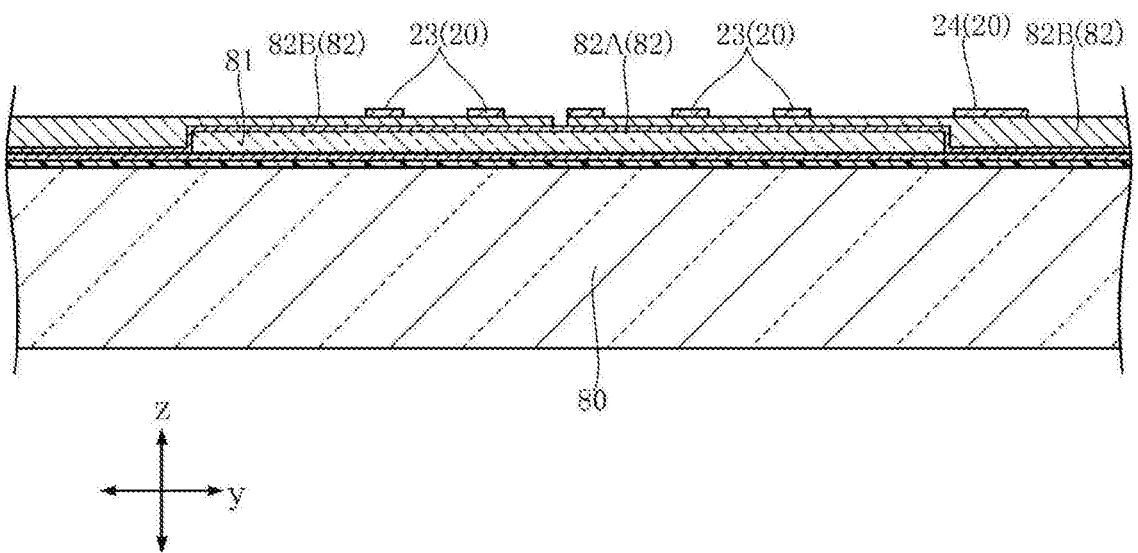
FIG. 19 is a cross-sectional view for explaining a process of manufacturing the semiconductor device shown in FIG. 1.

Next, as shown in FIGS. 17 to 19, a wiring layer 82 is formed on upper surfaces of the insulating layer 81 and a portion of the peeling layer 802 exposed from the plurality of penetrating portions 811 of the insulating layer 81. The process of forming the wiring layer 82 includes a step of forming a base layer 82A shown in FIG. 17, a step of forming a plurality of main body layers 82B shown in FIG. 18, and a step of forming the plurality of bump portions 23 and the plurality of pedestal portion 24 shown in FIG. 19.

First, as shown in FIG. 17, the base layer 82A that covers the insulating layer 81 and a portion of the peeling layer 802, which is exposed from the plurality of penetrating portions 811 of the insulating layer 81, is formed. The base layer 82A is formed by forming a barrier layer on the entirety of the insulating layer 81 and a portion of the peeling layer 802, which is exposed from the plurality of penetrating portions 811 of the insulating layer 81, by a sputtering method and then forming a seed layer on the entirety of the barrier layer by a sputtering method. The barrier layer is made of titanium having a thickness of 100 nm to 300 nm. The seed layer is made of copper having a thickness of 200 nm to 600 nm.

Next, as shown in FIG. 18, the plurality of main body layers 82B is formed on the upper surface of the base layer 82A. The plurality of main body layers 82B is made of copper. The plurality of main body layers 82B is formed by performing lithographic patterning on the upper surface of the base layer 82A and then performing electrolytic plating using the base layer 82A as a conductive path. Through this step, each of the plurality of penetrating portions 811 of the insulating layer 81 is filled with the base layer 82A and any of the plurality of main body layers 82B.

Next, as shown in FIG. 19, the plurality of bump portions 23 and the plurality of pedestal portions 24 are formed on the plurality of main body layers 82B. The plurality of bump portions 23 and the plurality of pedestal portions 24 are formed by performing lithographic patterning on the plurality of base layer 82A and the plurality of main body layers 82B and then precipitating a copper layer by electrolytic plating using the base layer 82A and the main body layers 82B as a conductive path. As another method, the plurality of bump portions 23 and the plurality of pedestal portions 24 may be formed by, after performing the lithographic patterning, forming a metal thin film having the same configuration as the base layer 82A on the entirety of lithographic pattern by a sputtering method and then precipitating a copper layer by electrolytic plating using the metal thin film as a conductive path. The metal thin film and the copper layer, which are located around the plurality of bump portions 23 and the plurality of pedestal portions 24 and stacked on the upper surface of the lithographic pattern, are removed by lift-off together with the lithographic pattern. Through this step, the formation of the wiring layer 82 is completed.

Figure 20:
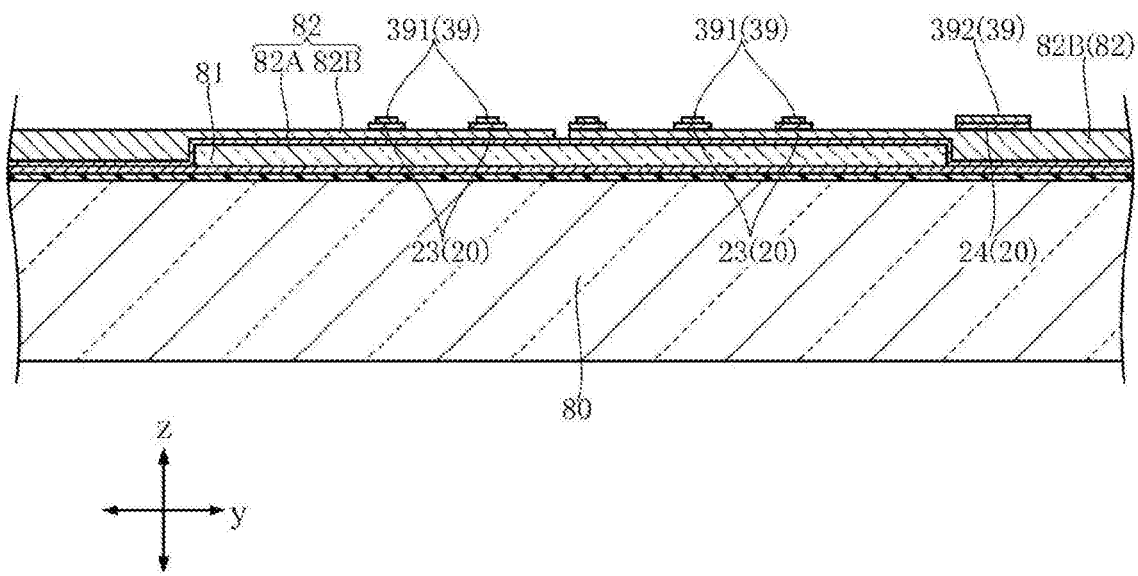
FIG. 20 is a cross-sectional view for explaining a process of manufacturing the semiconductor device shown in FIG. 1.

Next, as shown in FIG. 20, the plurality of first bonding layers 391 is individually formed on the upper surfaces of the plurality of bump portions 23. In addition, the plurality of second bonding layers 392 is individually formed on the upper surfaces of the plurality of pedestal portions 24. In order to form the plurality of first bonding layers 391 and the plurality of second bonding layers 392, first, lithographic patterning is performed with respect to the wiring layer 82. As a result, a portion of each of the plurality of bump portions 23 and the plurality of pedestal portions 24 is exposed from the lithographic pattern. Next, a nickel layer and an alloy layer containing tin are sequentially formed on the upper surface of each of the plurality of bump portions 23 and the plurality of pedestal portions 24 by electrolytic plating using the wiring layer 82 as a conductive path. Finally, the lithographic pattern is removed. Thus, the formation of the first plurality of first bonding layers 391 and the plurality of second bonding layers 392 is completed. As another method, the plurality of first bonding layers 391 and the plurality of second bonding layers 392 can be also formed by the following procedure after performing the lithographic patterning. First, a metal thin film having the same configuration as the base layer 82A is formed over an entirety of the lithographic pattern by a sputtering method. Then, a nickel layer and an alloy layer containing tin are sequentially formed on the metal thin film by electrolytic plating using the metal thin film as a conductive path. Finally, the lithographic pattern and the metal thin film, the nickel layer, and the alloy layer, which are stacked on the upper surface of the lithographic pattern, are removed by lift-off.

Figure 21:
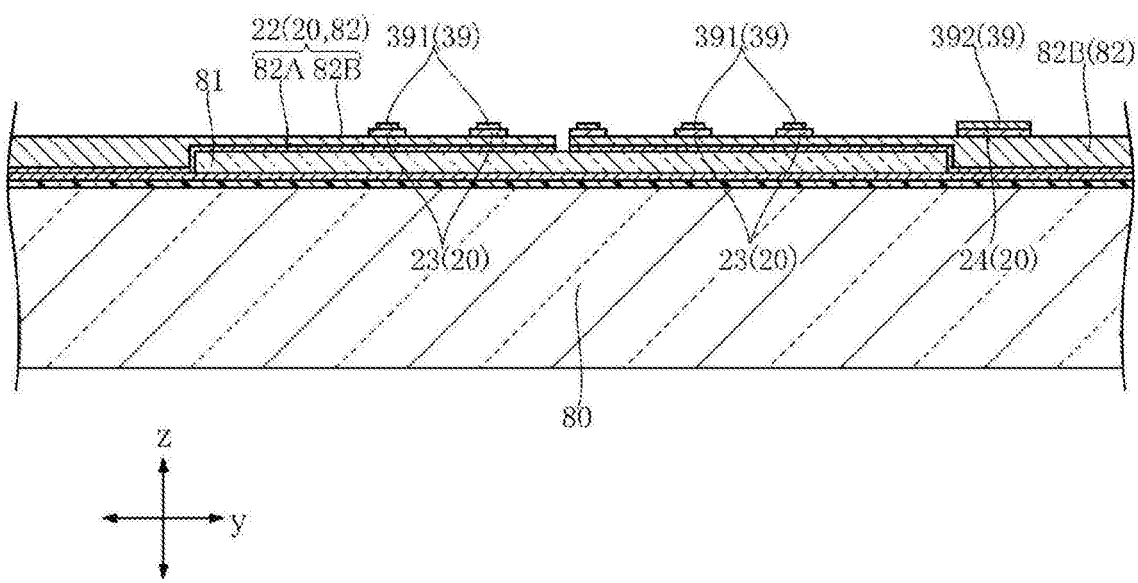
FIG. 21 is a cross-sectional view for explaining a process of manufacturing the semiconductor device shown in FIG. 1.

Next, as shown in FIG. 21, a portion of the base layer 82A is removed. The removal target of the base layer 82A is a portion where the plurality of main body layers 82B is not stacked. The base layer 82A is removed by wet etching using a mixed solution of sulfuric acid ($H_2SO_4$) and hydrogen peroxide ($H_2O_2$). The base layer 82A, which is stacked and remains on the upper surface of the insulating layer 81, and a portion of the plurality of main body layers 82B, which is stacked on the base layer 82A, become the main body portions 22 of the wiring layer 20 of the semiconductor device A10.

Figure 22:
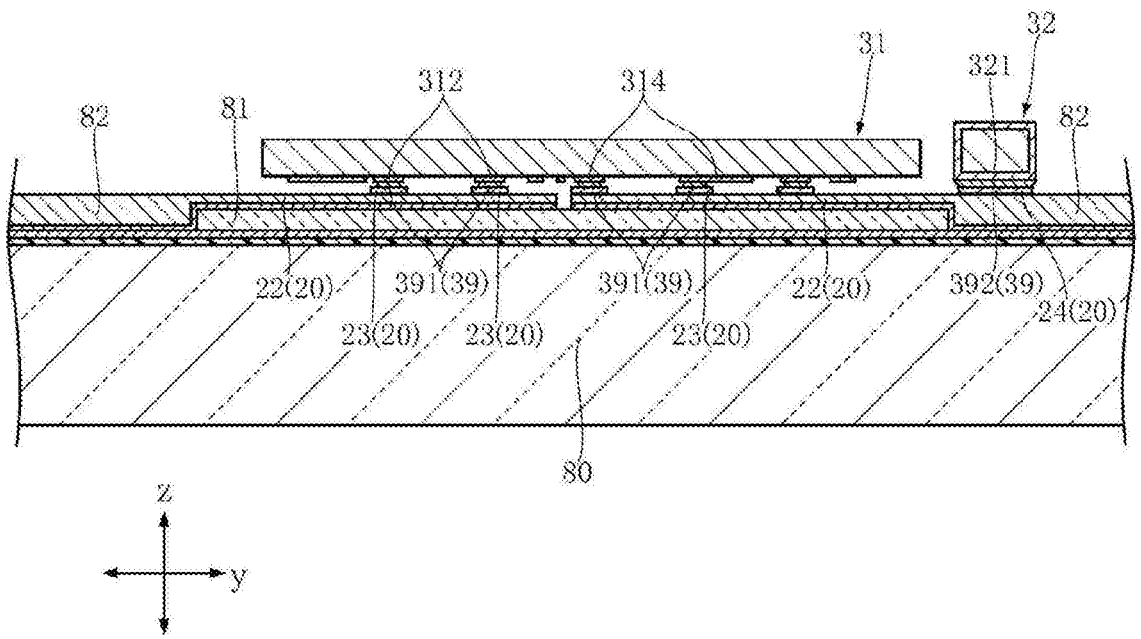
FIG. 22 is a cross-sectional view for explaining a process of manufacturing the semiconductor device shown in FIG. 1.

Next, as shown in FIG. 22, the semiconductor element 31 is bonded to the plurality of bump portions 23 via the plurality of first bonding layers 391. In addition, the plurality of electronic components 32 are bonded to the plurality of pedestal portions 24 via the plurality of second bonding layers 392. The semiconductor element 31 is bonded to the plurality of bump portions 23 by flip-chip bonding. First, each of the pair of electrodes 321 in each of the plurality of electronic components 32 is temporarily attached to any of the plurality of second bonding layers 392. Next, the rewiring 314 of the semiconductor element 31 and the plurality of dummy pads 312 of the semiconductor element 31 are individually temporarily attached to the plurality of first bonding layers 391 by using a collet. Next, the plurality of first bonding layers 391 and the plurality of second bonding layers 392 are melted by reflow. Finally, the plurality of first bonding layers 391 and the plurality of second bonding layers 392, which are melted, are solidified by cooling. Thus, the bonding of the semiconductor element 31 to the plurality of bump portions 23 and the bonding of the plurality of electronic components 32 to the pedestal portions 24 are both completed.

Figure 23:
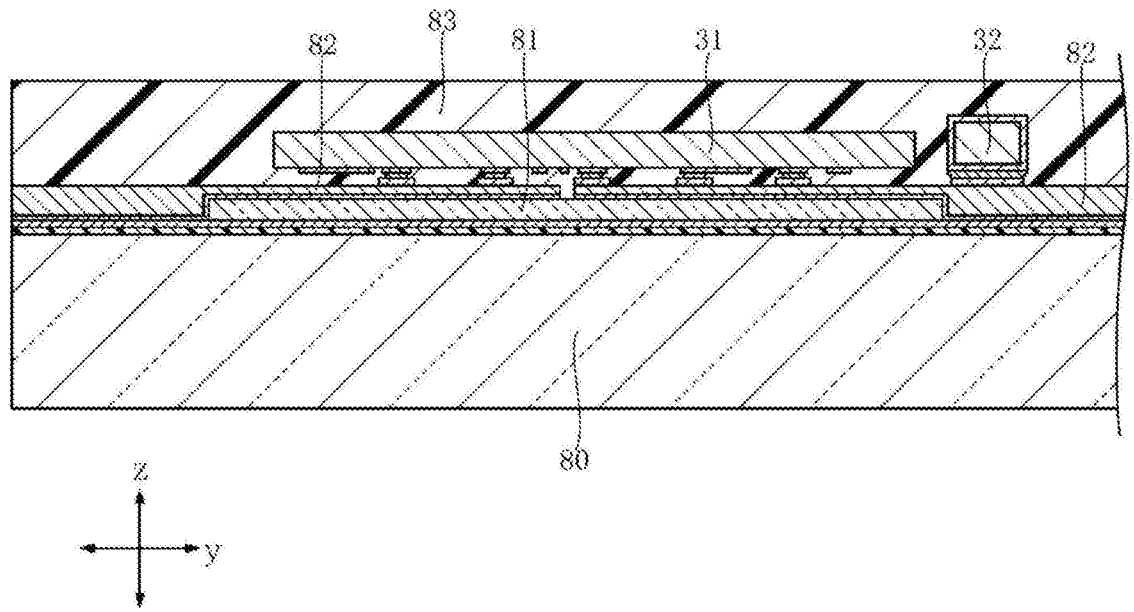
FIG. 23 is a cross-sectional view for explaining a process of manufacturing the semiconductor device shown in FIG. 1.

Next, as shown in FIG. 23, a sealing resin 83, which is contact with both the insulating layer 81 and the wiring layer 82, is formed. The sealing resin 83 is made of a material containing a black epoxy resin. The sealing resin 83 is formed by compression molding. Through this step, the semiconductor element 31 and the electronic components 32 are covered with the sealing resin 83.

Figure 24:
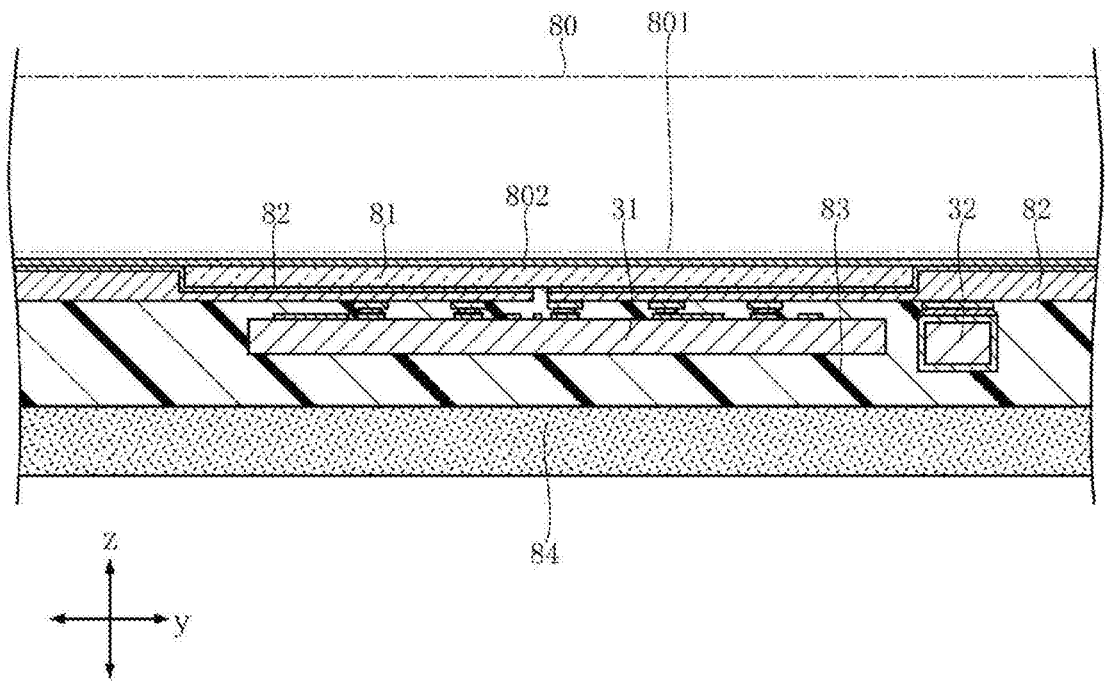
FIG. 24 is a cross-sectional view for explaining a process of manufacturing the semiconductor device shown in FIG. 1.

Next, as shown in FIG. 24, after a tape 84 is attached on the surface of the sealing resin 83 facing the thickness direction z, the base material 80 and the temporary fixing layer 801 are removed. First, the tape 84 is attached on the surface of the sealing resin 83. The tape 84 is a dicing tape. The tape 84 is located on a side opposite to the insulating layer 81 and the wiring layer 82 with respect to the sealing resin 83 in the thickness direction z. Then, the base material 80 is irradiated with a laser beam. This weakens the bonding between the base material 80 and the temporary fixing layer 801 so that the base material 80 can be peeled off from the temporary fixing layer 801. Finally, the temporary fixing layer 801 is irradiated with plasma so that the temporary fixing layer 801 attached to the peeling layer 802 is removed.

Figure 25:
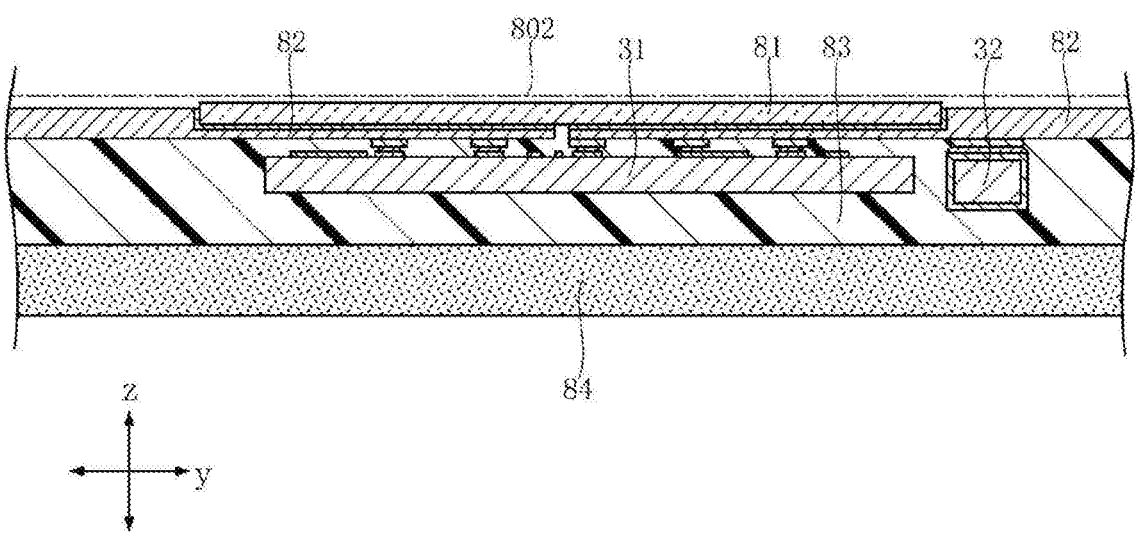
FIG. 25 is a cross-sectional view for explaining a process of manufacturing the semiconductor device shown in FIG. 1.

Next, as shown in FIG. 25, the peeling layer 802 is removed. The peeling layer 802 is removed by wet etching using a mixed solution of sulfuric acid and hydrogen peroxide. Through this step, a portion of the wiring layer 82 can be visually recognized from the insulating layer 81.

Figure 26:
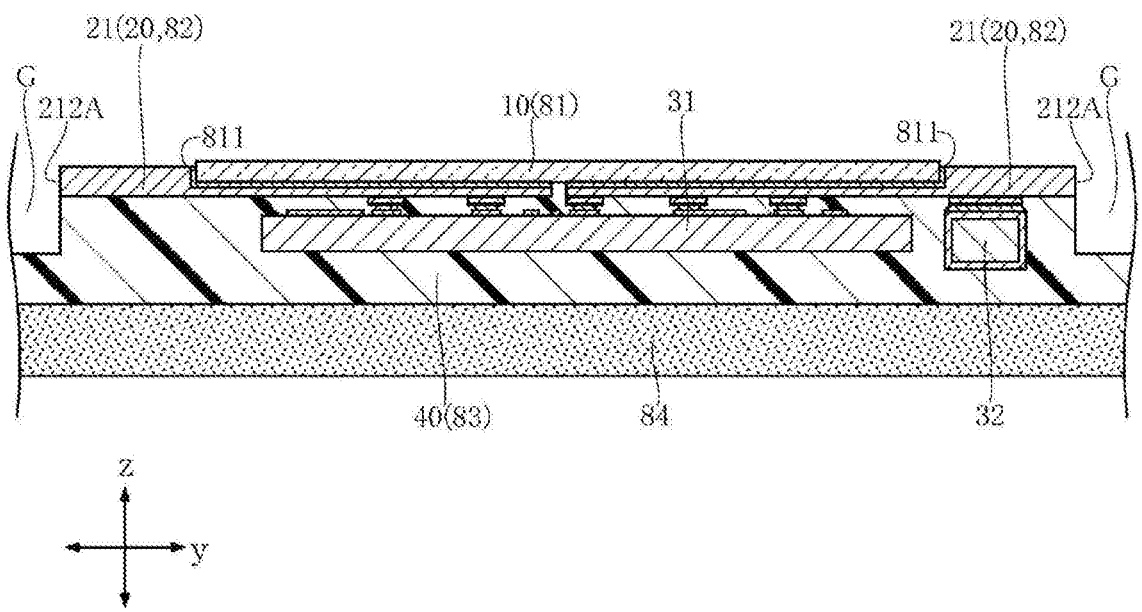
FIG. 26 is a cross-sectional view for explaining a process of manufacturing the semiconductor device shown in FIG. 1.

Next, as shown in FIG. 26, the insulating layer 81, the wiring layer 82 located in the plurality of penetrating portions 811 of the insulating layer 81, and a portion of the sealing resin 83 are divided into a plurality of individual pieces by cutting in a grid shape along both the first direction x and the second direction y. A dicing blade or the like is used for cutting. However, the tape 84 is not cut in this step. Therefore, a groove G is formed between the two adjacent pieces. Through this step, the insulating layer 81 and the sealing resin 83, which are divided into the individual pieces, become the insulating layer 10 and the sealing resin 40, respectively, of the semiconductor device A10. In addition, the wiring layer 82 located in the plurality of penetrating portions 811 of the insulating layer 81, which is divided into the individual pieces, becomes the base portions 21 of the wiring layer 20 of the semiconductor device A10. Through this step, the exposed portions 212A of the plurality of base portions 21 can be visually recognized from the sealing resin 40.

Figure 27:
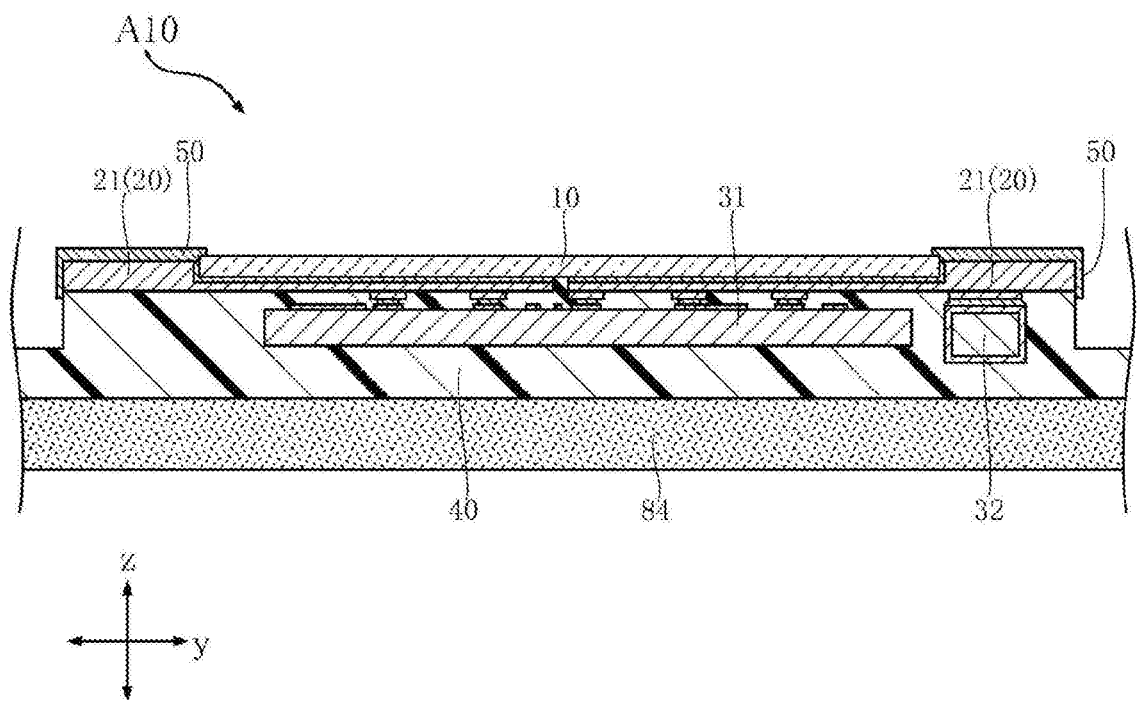
FIG. 27 is a cross-sectional view for explaining a process of manufacturing the semiconductor device shown in FIG. 1.

Finally, as shown in FIG. 27, the plurality of terminals 50, which individually cover a portion of each of the plurality of base portions 21 of the wiring layer 20, are formed. The plurality of terminals 50 is formed by electroless plating. Through the above steps, the semiconductor device A10 is manufactured.

Next, the operation and effects of the semiconductor device A10 will be described.

The semiconductor device A10 includes the wiring layer 20, the plurality of bonding layers (the plurality of first bonding layers 391) arranged on the wiring layer 20 and having conductivity, and the semiconductor element 31 which includes the plurality of pads 311 provided on the rear surface 31A and is bonded to the wiring layer 20 via the bonding layers. The plurality of pads 311 is electrically connected to a circuit formed inside the semiconductor element 31 and any of the bonding layers. As shown in FIG. 1, when viewed along the thickness direction z, at least one of the plurality of pads 311 is located to be spaced apart from the bonding layers. That is, regardless of the arrangement distribution of the plurality of pads 311, the plurality of bonding layers is arranged in a grid pattern with equal intervals. As a result, when the semiconductor device A10 is used, the heat distribution of the plurality of bonding layers according to the heat generated from the semiconductor element 31 becomes more uniform. Therefore, according to the semiconductor device A10, it is possible to reduce the concentration of thermal stress that acts on the plurality of bonding layers interposed between the wiring layer 20 and the semiconductor element 31.

The semiconductor element 31 includes the insulating film 313, which is arranged on the rear surface 31A and exposes a portion of each of the plurality of pads 311, and the rewiring 314 which is provided on the insulating film 313. The rewiring 314 is connected to at least one of the plurality of pads 311 and is bonded to the wiring layer 20 via at least one of the plurality of bonding layers. As a result, as shown in FIG. 1, in the semiconductor device A10, even when any of the plurality of pads 311 is located to be spaced apart from the plurality of bonding layers when viewed in the thickness direction z, the corresponding pad 311 can be electrically connected to any of the plurality of bonding layers via the rewiring 314.

The semiconductor element 31 includes the dummy pad 312 provided on the rear surface 31A and electrically insulated from the circuit configured inside the semiconductor element 31. The dummy pad 312 is bonded to the wiring layer 20 via any of the plurality of bonding layers. Thus, it is possible to alleviate complexity of the rewiring 314 provided in consideration of the respective layouts of the plurality of pads 311 and the plurality of bonding layers.

The dummy pad 312 faces any of the plurality of bonding layers located on the outermost periphery with respect to the center C (see FIG. 2) of the semiconductor element 31 when viewed along the thickness direction z. It is known that the thermal stress, which acts on each of the plurality of bonding layers, gradually increases with distance from the center C of the semiconductor element 31 when viewed along the thickness direction z. Further, the dummy pad 312 does not contribute to conduction between the semiconductor element 31 and the wiring layer 20. Thus, with respect to the thermal stress acting on the bonding layers, since the dummy pad 312 is bonded to the bonding layer on which a relatively large thermal stress acts, even if a crack due to the thermal stress occurs in the bonding layer, it is possible to avoid inhibition of conduction between the semiconductor element 31 and the wiring layer 20.

The dummy pad 312 faces any of the four bonding layers located at the four corners among the plurality of bonding layers when viewed along the thickness direction z. It is known that the thermal stress acting on each of the four bonding layers is particularly large with respect to the thermal stress acting on the plurality of bonding layers. As a result, since the dummy pad 312 is bonded to the bonding layer to which a particularly large thermal stress acts, it is possible to more effectively avoid inhibition of conduction between the semiconductor element 31 and the wiring layer 20.

The wiring layer 20 includes the plurality of bump portions 23 protruding from any of the main body portions 22 in the thickness direction z. The plurality of bonding layers are individually arranged with respect to the plurality of bump portions 23. As a result, in the process of manufacturing the semiconductor device A10 shown in FIG. 22, when the bonding layers are melted by reflow, surface tension occurs in each of the plurality of melted bonding layers at the peripheral edge of any of the plurality of bump portions 23 in which the bonding layer is arranged. Therefore, it is possible to prevent the plurality of melted bonding layers from entering the main body portions 22.

The semiconductor device A10 further includes the plurality of electronic components 32 having the pair of electrodes 321. The wiring layer 20 has the plurality of pedestal portions 24 protruding from any of the plurality of main body portions 22 in the thickness direction z. The pair of electrodes 321 in each of the plurality of electronic components 32 is individually bonded to two adjacent pedestal portions 24 among the pedestal portions 24. Thus, the plurality of electronic components 32 can control voltage adjustment of electric signals input to the semiconductor element 31. Therefore, the number of electronic components, which are mounted on the wiring board together with the semiconductor device A10, can be reduced.

The semiconductor device A10 further includes the insulating layer 10 located on the side of the wiring layer 20 opposite to the semiconductor element 31 in the thickness direction z. The insulating layer 10 has the plurality of penetrating portions 11 penetrating in the thickness direction z. The wiring layer 20 has the plurality of base portions 21 including portions individually accommodated in the plurality of penetrating portions 11. Each of the plurality of base portions 21 has the bottom surface 211 and the side surface 212. The side surface 212 of each of the plurality of base portions 21 includes an exposed portion 212A exposed from any of the plurality of penetrating portions 11. The semiconductor device A10 further includes the plurality of terminals 50 that individually cover the bottom surfaces 211 of the base portions 21. The plurality of terminals 50 have the bottom portion 501 that covers the bottom surface 211 of any of the plurality of base portions 21, and the side portion 502 that covers the exposed portion 212A of any of the plurality of base portions 21 connected to the bottom surface 211. As a result, when the semiconductor device A10 is mounted on the wiring board by solder, the solder adheres not only to the bottom portion 501 but also to the side portion 502 in each of the plurality of terminals 50. Therefore, the mounting strength of the semiconductor device A10 on the wiring board can be improved.

Second Embodiment

Figure 28:
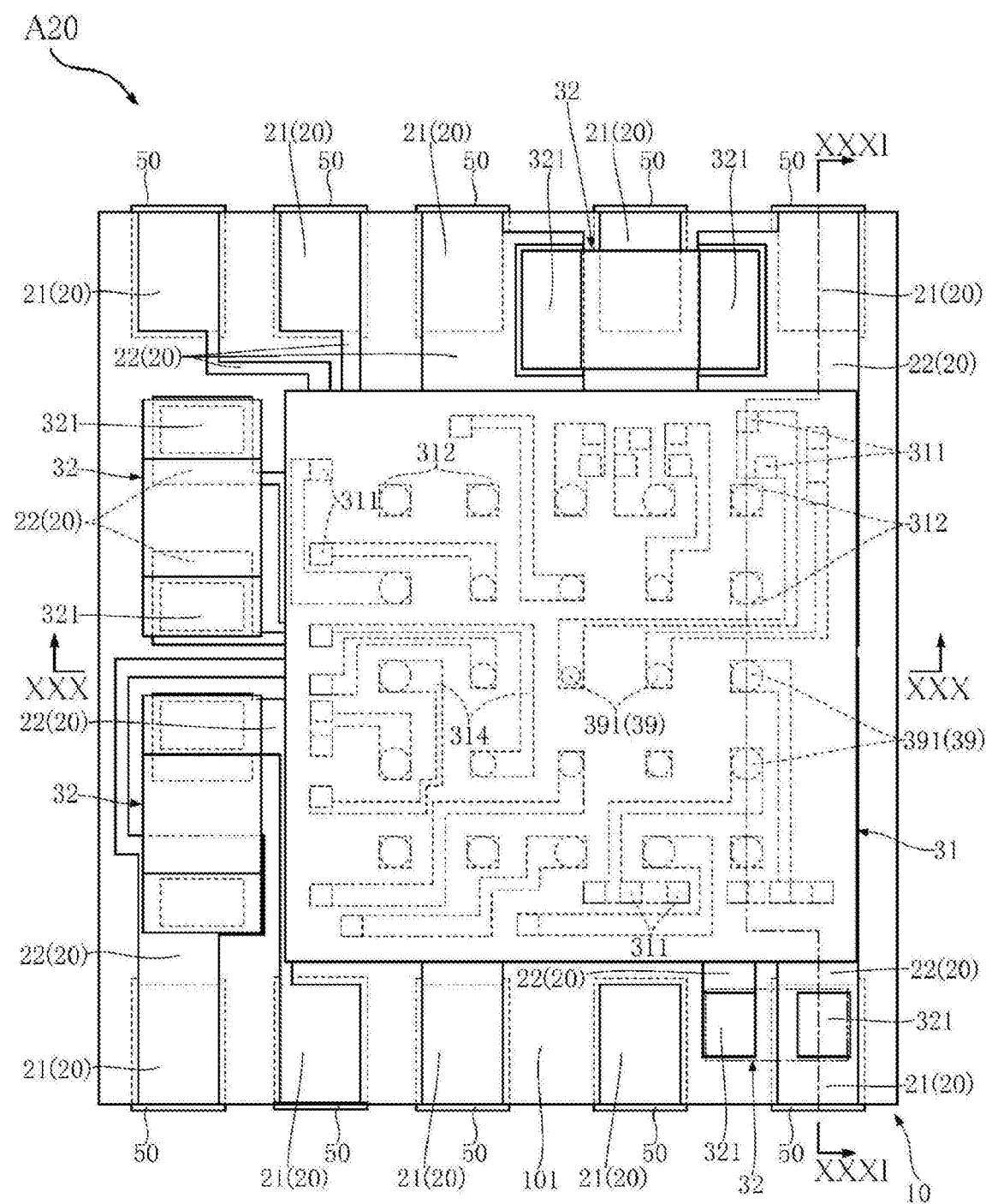
FIG. 28 is a plan view of a semiconductor device according to a second embodiment of the present disclosure, in which a sealing resin is illustrated to be transparent.
Figure 29:
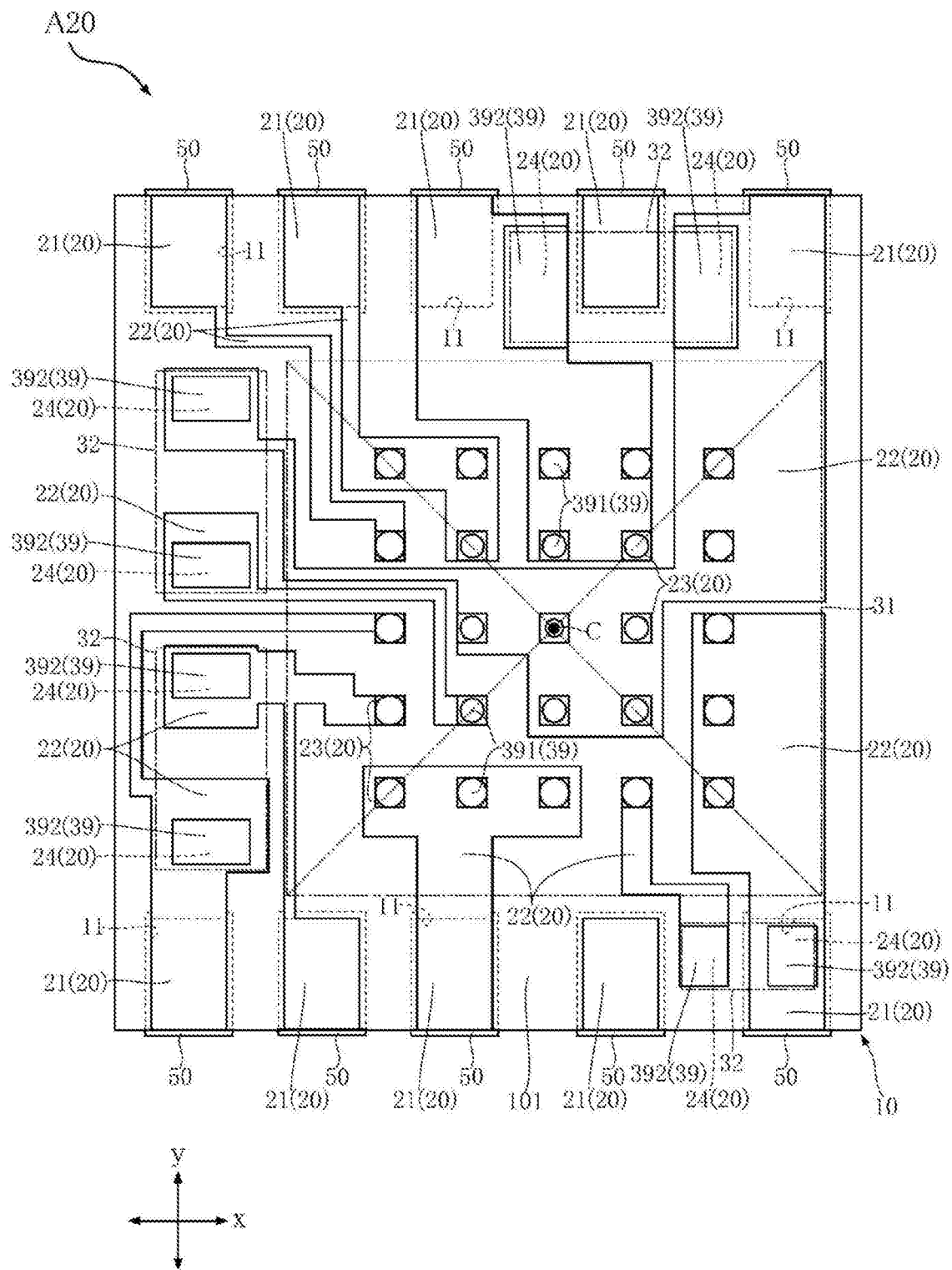
FIG. 29 is a plan view corresponding to FIG. 28, in which a semiconductor element, a plurality of electronic components, and a sealing resin are illustrated to be transparent.

A semiconductor device A20 according to a second embodiment of the present disclosure will be described with reference to FIGS. 28 to 32. In these figures, the same or similar elements as those of the semiconductor device A10 described above are denoted by the same reference numerals, and explanation thereof will be omitted. Here, FIG. 28, for convenience of understanding, illustrates the sealing resin 40 to be transparent. For convenience of understanding, FIG. 29 further illustrates the semiconductor element 31 and the electronic components 32 to be transparent with respect to FIG. 28. In FIG. 29, the transparent semiconductor element 31 and electronic components 32 are shown by imaginary lines.

The semiconductor device A20 is different from the above-described semiconductor device A10 in the configuration of the plurality of first bonding layers 391 included in the plurality of bonding layers 39.

Figure 30:
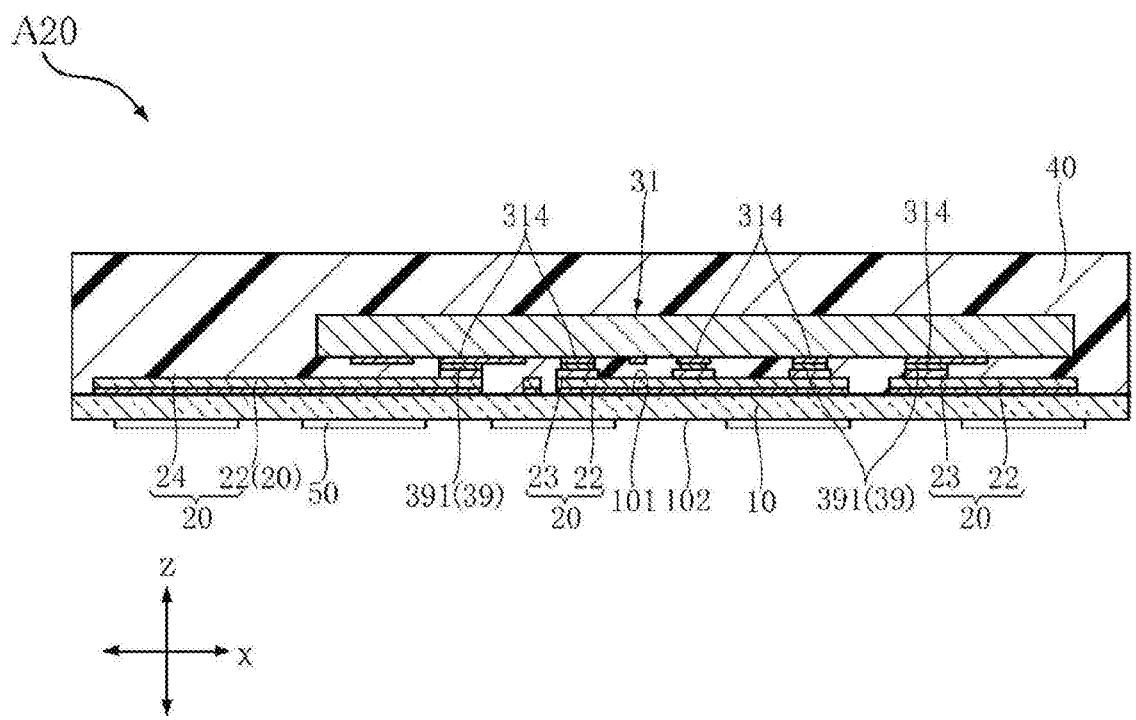
FIG. 30 is a cross-sectional view taken along line XXX-XXX in FIG. 28.
Figure 31:
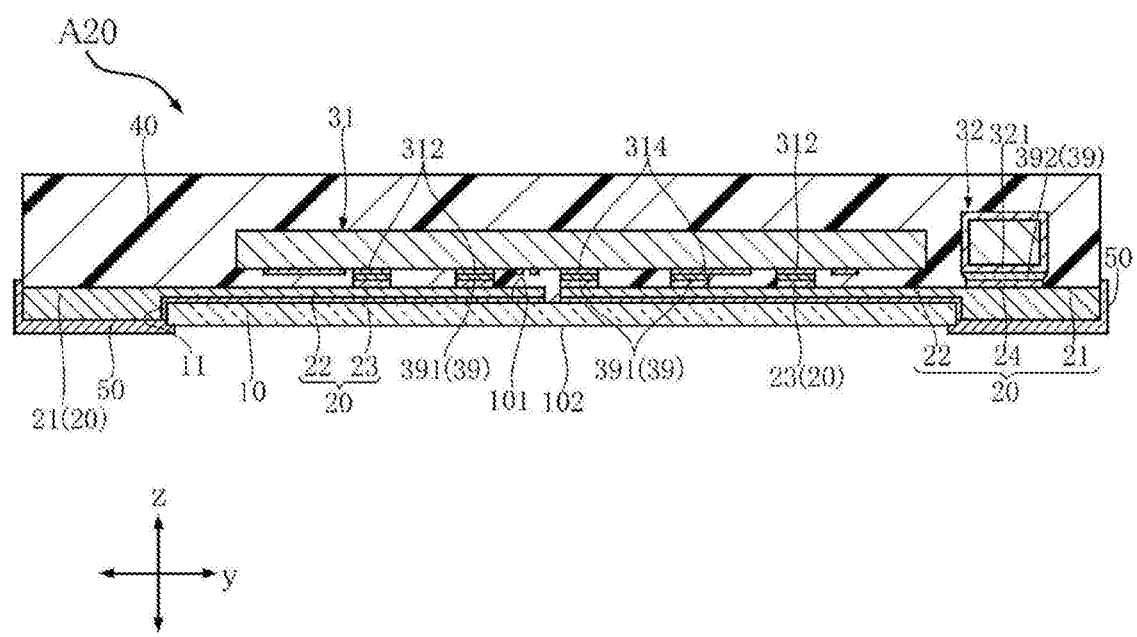
FIG. 31 is a cross-sectional view taken along line XXXI-XXXI in FIG. 28.
Figure 32:
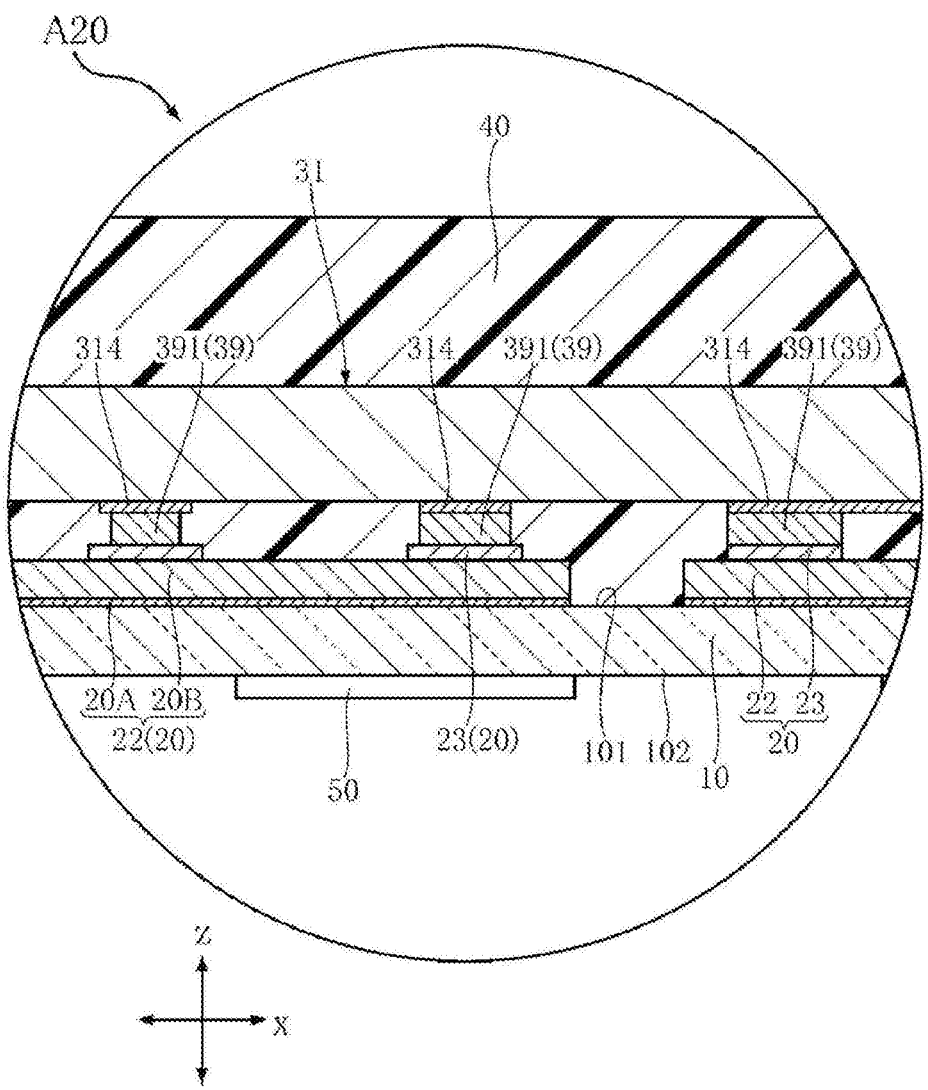
FIG. 32 is a partially enlarged view of FIG. 30.

As shown in FIGS. 29, 30, and 32, in the semiconductor device A20, a size of an outline of each of the plurality of first bonding layers 391 gradually increases from the center C of the semiconductor element 31 toward the periphery of the semiconductor element 31 when viewed along the thickness direction z. As shown in FIGS. 29 and 31, among the plurality of first bonding layers 391, a size of an outline of each of the first bonding layers 391, which are located on the outermost periphery with respect to the center C of the semiconductor element 31 when viewed along the thickness direction z, is substantially equal to each other.

Next, the operation and effects of the semiconductor device A20 will be described.

The semiconductor device A20 includes the wiring layer 20, the plurality of bonding layers (the plurality of first bonding layers 391) which is arranged on the wiring layer 20 and has conductivity, and the semiconductor element 31 which includes the pads 311 provided on the rear surface 31A and is bonded to the wiring layer 20 via the plurality of bonding layers. The plurality of pads 311 are electrically connected to a circuit formed inside the semiconductor element 31 and any of the plurality of bonding layers. As shown in FIG. 28, when viewed along the thickness direction z, at least one of the plurality of pads 311 is located to be spaced apart from the plurality of bonding layers. Therefore, according to the semiconductor device A20, it is possible to reduce the concentration of thermal stress that acts on the bonding layers interposed between the wiring layer 20 and the semiconductor element 31.

In the semiconductor device A20, a size of an outline of each of the plurality of bonding layers when viewed along the thickness direction z gradually increases from the center C of the semiconductor element 31 (see FIG. 29) toward the periphery of the semiconductor element 31. It is known that thermal stress, which acts on each of the bonding layers, gradually increases with distance from the center C of the semiconductor element 31 when viewed along the thickness direction z. Therefore, by adopting such a configuration, it is possible to more effectively equalize the thermal stress acting on each of the bonding layers.

The present disclosure may not be limited to the semiconductor device A10 and the semiconductor device A20 described above. The specific configuration of each part of the present disclosure can be modified in various ways in design.

According to the present disclosure in some embodiments, it is possible to reduce the concentration of thermal stress that acts on a plurality of bonding layers interposed between a wiring layer and a semiconductor element.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a wiring layer;
   a plurality of bonding layers arranged on the wiring layer and having conductivity;
   a semiconductor element having a rear surface facing the wiring layer and a plurality of pads provided on the rear surface, and bonded to the wiring layer via the plurality of bonding layers;
   one or more terminals connected to the wiring layer; and
   an insulating layer that is located on a side opposite to the semiconductor element with respect to the wiring layer in a thickness direction, and has a main surface, a rear surface, and a side surface between the main surface and the rear surface of the insulating layer,
      wherein the main surface of the insulating layer and the rear surface of the insulating layer face opposite sides in the thickness direction and the main surface of the insulating layer faces the rear surface of the semiconductor element,
      wherein the plurality of bonding layers are arranged in a grid shape when viewed along the thickness direction,
      wherein each of the plurality of pads is electrically connected to a circuit formed inside the semiconductor element and any of the plurality of bonding layers,
      wherein at least one of the plurality of pads is located to be spaced apart from the plurality of bonding layers when viewed along the thickness direction,
      wherein the plurality of bonding layers overlaps the semiconductor element when viewed along the thickness direction,
      wherein the semiconductor element includes an insulating film, which is arranged on the rear surface of the semiconductor element and exposes a portion of each of the plurality of pads, and a rewiring provided on the insulating film,
      wherein the rewiring includes:
         a plurality of bump layers, each of which is bonded to the wiring layer via any of the plurality of bonding layers; and
         a main body layer connected to at least one of the plurality of pads, and formed to extend to be in contact with the insulating film and to be connected to at least one of the plurality of bump layers,
      wherein the semiconductor element includes a dummy pad provided on the insulating film and electrically insulated from the circuit,
      wherein the dummy pad is bonded to the wiring layer via any of the plurality of bonding layers,
      wherein the plurality of bonding layers are arranged at equal intervals,
      wherein the plurality of bump layers is disposed not to overlap the plurality of pads when viewed along the thickness direction,
      wherein each of the one or more terminals is configured to cover a portion of the side surface of the insulating layer and a portion of the rear surface of the insulating layer, and
      wherein each of the one or more terminals is formed to protrude from the rear surface of the insulating layer in the thickness direction.

2. The semiconductor device of claim 1, wherein the plurality of bump layers protrudes from the main body layer in the thickness direction.

3. The semiconductor device of claim 1, wherein a size of an outline of each of the plurality of bonding layers gradually increases from a center of the semiconductor element toward a peripheral edge of the semiconductor element when viewed along the thickness direction.

4. The semiconductor device of claim 1, wherein the dummy pad faces any of the plurality of bonding layers, which is located on an outermost periphery with respect to a center of the semiconductor element when viewed along the thickness direction.

5. The semiconductor device of claim 4, wherein the dummy pad faces any of four bonding layers located at four corners among the plurality of bonding layers when viewed in the thickness direction.

6. The semiconductor device of claim 1,
   wherein the wiring layer has a plurality of main body portions arranged on the main surface, and
   wherein each of the plurality of bonding layers is arranged on any of the plurality of main body portions.

7. The semiconductor device of claim 6, wherein the wiring layer includes a plurality of bump portions protruding in the thickness direction from any of the plurality of main body portions, and
   wherein the plurality of bonding layers are individually arranged with respect to the plurality of bump portions.

8. The semiconductor device of claim 6, wherein the insulating layer has a plurality of penetrating portions penetrating from the main surface in the thickness direction,
   wherein the wiring layer has a plurality of base portions which includes portions individually accommodated in the plurality of penetrating portions, any of the plurality of base portions being bonded to any of the plurality of main body portions, and wherein each of the plurality of base portions faces a side opposite to the main surface in the thickness direction and has a bottom surface exposed from any of the plurality of penetrating portions.

9. The semiconductor device of claim 8, wherein the one or more terminals individually covers bottom surfaces of the plurality of base portions.

10. The semiconductor device of claim 9,
wherein each of the plurality of base portions has a side surface that is connected to a bottom surface of any of the plurality of base portions and faces a direction orthogonal to the thickness direction, and
wherein the side surface of each of the plurality of base portions includes an exposed portion exposed from any of the plurality of penetrating portions.

11. The semiconductor device of claim 10, wherein each of the one or more terminals has a bottom portion that covers the bottom surface of any of the plurality of base portions, and a side portion that covers the exposed portion of any of the plurality of base portions, which is connected to the bottom portion.

12. The semiconductor device of claim 6, further comprising a plurality of electronic components,
wherein each of the plurality of electronic components includes a pair of electrodes located to be spaced apart from each other, and
wherein the pair of electrodes in each of the plurality of electronic components is bonded to the wiring layer in a state where conduction with the wiring layer is secured.

13. The semiconductor device of claim 12,
wherein the wiring layer has a plurality of pedestal portions protruding from any of the plurality of main body portions in the thickness direction, and
wherein the pair of electrodes in each of the plurality of electronic components is individually bonded to two adjacent pedestal portions among the plurality of pedestal portions.

14. The semiconductor device of claim 12, further comprising a sealing resin,
wherein the sealing resin is in contact with both sides of the main surface and the wiring layer and covers the semiconductor element and the plurality of electronic components.

15. A semiconductor device comprising:
a wiring layer;
a plurality of bonding layers arranged on the wiring layer and having conductivity;
a semiconductor element having a rear surface facing the wiring layer and a plurality of pads provided on the rear surface, and bonded to the wiring layer via the plurality of bonding layers;
one or more terminals connected to the wiring layer; and
an insulating layer that is located on a side opposite to the semiconductor element with respect to the wiring layer in a thickness direction, and has a main surface, a rear surface, and a side surface between the main surface and the rear surface of the insulating layer,
wherein the main surface of the insulating layer and the rear surface of the insulating layer face opposite sides in the thickness direction and the main surface of the insulating layer faces the rear surface of the semiconductor element, wherein the plurality of bonding layers are arranged in a grid shape when viewed along the thickness direction,
wherein each of the plurality of pads is electrically connected to a circuit formed inside the semiconductor element and any of the plurality of bonding layers,
wherein at least one of the plurality of pads is located to be spaced apart from the plurality of bonding layers when viewed along the thickness direction,
wherein the plurality of bonding layers overlaps the semiconductor element when viewed along the thickness direction,
wherein the semiconductor element includes an insulating film, which is arranged on the rear surface of the semiconductor element and exposes a portion of each of the plurality of pads, and a rewiring provided on the insulating film,
wherein the rewiring includes:
a plurality of bump layers, each of which is bonded to the wiring layer via any of the plurality of bonding layers; and
a main body layer connected to at least one of the plurality of pads, and formed to extend to be in contact with the insulating film and to be connected to at least one of the plurality of bump layers,
wherein the semiconductor element includes a dummy pad provided on the insulating film and electrically insulated from the circuit,
wherein the dummy pad is bonded to the wiring layer via any of the plurality of bonding layers,
wherein the plurality of bonding layers is arranged at equal intervals,
wherein the plurality of bump layers is disposed not to overlap the plurality of pads when viewed along the thickness direction,
wherein each of the one or more terminals is configured to cover a portion of the side surface of the insulating layer and a portion of the rear surface of the insulating layer,
wherein each of the one or more terminals is formed to protrude from the rear surface of the insulating layer in the thickness direction,
wherein the wiring layer has a plurality of base portions, each of the plurality of base portions faces a side opposite to the main surface in the thickness direction and has a bottom surface exposed from any of a plurality of penetrating portions of the insulating layer penetrating from the main surface in the thickness direction,
wherein each of the plurality of base portions has a side surface that is connected to a bottom surface of any of the plurality of base portions and faces a direction orthogonal to the thickness direction, the side surface of each of the plurality of base portions includes an exposed portion exposed from any of the plurality of penetrating portions, and
wherein each of the one or more terminals has a bottom portion that covers the bottom surface of any of the plurality of base portions, and a side portion that covers the exposed portion of the side surface of any of the plurality of base portions, which is connected to the bottom portion.

* * * * *